(12) United States Patent
Huang et al.

(10) Patent No.: US 11,830,392 B2
(45) Date of Patent: *Nov. 28, 2023

(54) ROLLABLE DISPLAY DEVICE

(71) Applicant: InnoLux Corporation, Miao-Li County (TW)

(72) Inventors: Yu-Chia Huang, Miao-Li County (TW); Yuan-Lin Wu, Miao-Li County (TW); Tsung-Han Tsai, Miao-Li County (TW); Kuan-Feng Lee, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/993,998

(22) Filed: Nov. 25, 2022

(65) Prior Publication Data

US 2023/0087590 A1    Mar. 23, 2023

Related U.S. Application Data

(63) Continuation of application No. 16/984,177, filed on Aug. 4, 2020, now Pat. No. 11,538,367.

(30) Foreign Application Priority Data

Sep. 3, 2019    (CN) .......................... 201910828180.5

(51) Int. Cl.
   *G09F 9/30* (2006.01)
   *H01L 27/15* (2006.01)

(52) U.S. Cl.
   CPC ............ *G09F 9/301* (2013.01); *H01L 27/156* (2013.01)

(58) Field of Classification Search
   CPC ....................................................... H05K 5/00
   See application file for complete search history.

(56) References Cited

U.S. PATENT DOCUMENTS

2019/0036068 A1* 1/2019 Kim ..................... H10K 59/87
2019/0318689 A1* 10/2019 Kim ..................... H10K 59/131

* cited by examiner

*Primary Examiner* — Jerry Wu
(74) *Attorney, Agent, or Firm* — Winston Hsu

(57) ABSTRACT

A rollable display device is unrollable in a direction, wherein the rollable display device includes a substrate, a plurality of light emitting units and a plurality of deformable units. The light emitting units define a light emitting layer on a surface of the substrate. The deformable units define a deformable layer on an opposite surface of the substrate. An edge of an unrolled portion of the deformable layer extends beyond an edge of the light emitting layer in the direction in an unrolled status. The direction is parallel to a longitudinal side of the rollable display device, the substrate extends beyond the light emitting layer, and the deformable units are aligned along the direction.

8 Claims, 14 Drawing Sheets

ROLLABLE DISPLAY DEVICE

CROSS REFERENCE TO RELATED APPLICATIONS

This application is a continuation application of U.S. application Ser. No. 16/984,177, filed on Aug. 4, 2020. The content of the application is incorporated herein by reference.

BACKGROUND OF THE DISCLOSURE

1. Field of the Disclosure

The present disclosure relates to a rollable display device and a transforming method of a rollable electronic device, and more particularly to a rollable display device having a deformable layer, and a transforming method of a rollable electronic device for adjusting a status of the rollable electronic device between a rolled status and an unrolled status.

2. Description of the Prior Art

Nowadays, a flexible electronic device (e.g., a rollable electronic device) is an electronic product in the new generation, and thus, the requirement of the flexible electronic device is enhanced correspondingly. In the conventional rollable electronic device, when an unrolled operation is performed, wrinkles are caused in the operating region (e.g., a display region) of the electronic device, such that a distortion of a display region is caused, thereby reducing the quality and the life of the conventional rollable electronic device. Accordingly, it is an important issue of reducing the above problems to improve the quality.

SUMMARY OF THE DISCLOSURE

According to an embodiment, the present disclosure provides a rollable display device unrollable in a direction, wherein the rollable display device includes a substrate, a plurality of light emitting units and a plurality of deformable units. The light emitting units define a light emitting layer on a surface of the substrate. The deformable units define a deformable layer on an opposite surface of the substrate. An edge of an unrolled portion of the deformable layer extends beyond an edge of the light emitting layer in the direction in an unrolled status. The direction is parallel to a longitudinal side of the rollable display device, the substrate extends beyond the light emitting layer, and the deformable units are aligned along the direction.

According to an embodiment, the present disclosure provides a rollable display device unrollable in a direction, wherein the rollable display device includes a substrate, a plurality of light emitting units and a plurality of deformable units. The light emitting units define a light emitting layer on a surface of the substrate. The deformable units define a deformable layer on an opposite surface of the substrate. An edge of an unrolled portion of the deformable layer is aligned with an edge of the light emitting layer in the direction in an unrolled status. The direction is parallel to a longitudinal side of the rollable display device, the substrate extends beyond the light emitting layer, and the deformable units are aligned along the direction.

DETAILED DESCRIPTION

Figure 1:
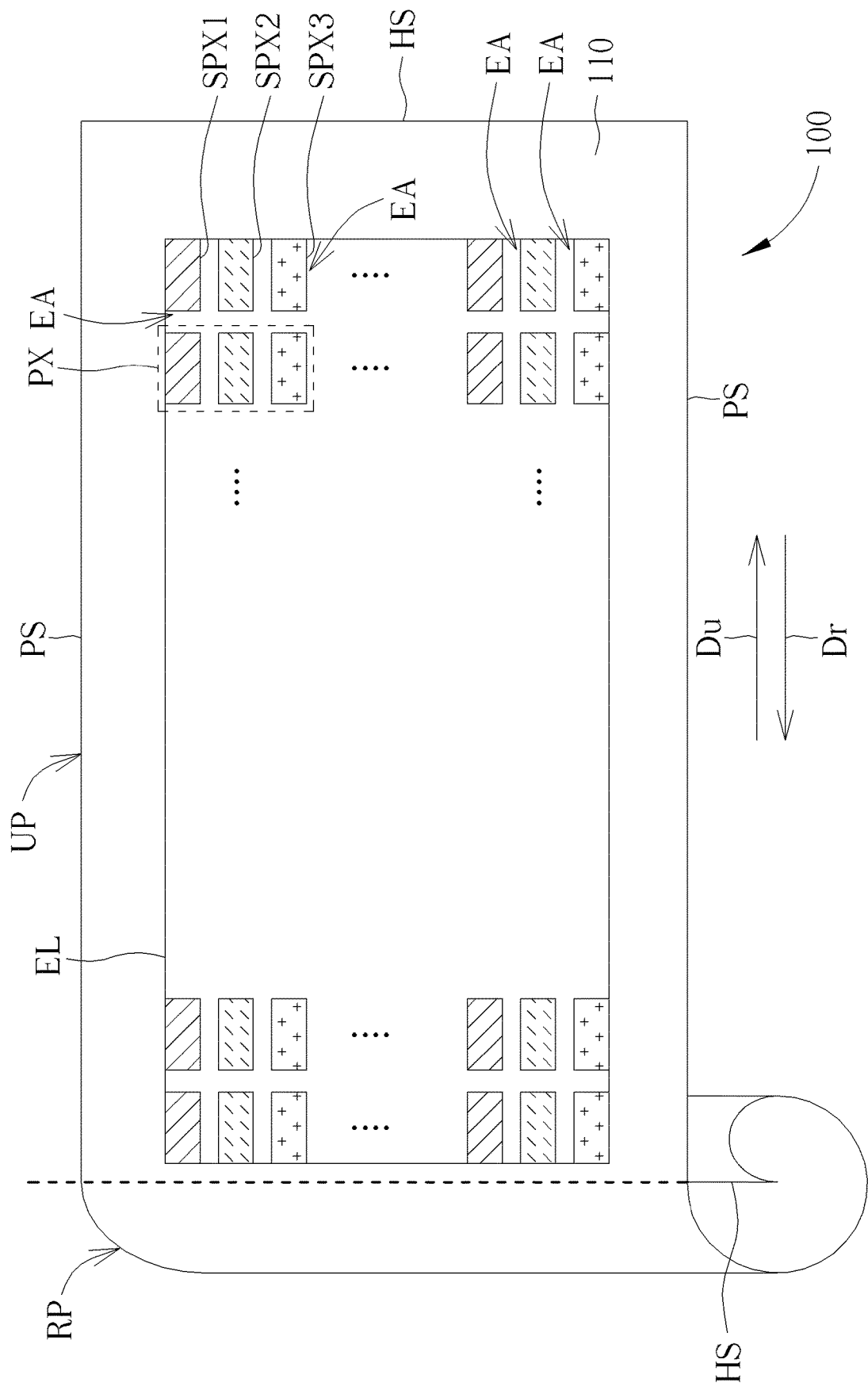
FIG. 1 is a schematic diagram showing an electronic device according to a first embodiment of the present disclosure.

The present disclosure may be understood by reference to the following detailed description, taken in conjunction with the drawings as described below. It is noted that, for purposes of illustrative clarity and being easily understood by the readers, various drawings of this disclosure show a portion of an electronic device in this disclosure, and certain elements in various drawings may not be drawn to scale. In addition, the number and dimension of each device shown in drawings are only illustrative and are not intended to limit the scope of the present disclosure.

Certain terms are used throughout the description and following claims to refer to particular components. As one skilled in the art will understand, electronic equipment manufacturers may refer to a component by different names. This document does not intend to distinguish between components that differ in name but not function. In the following description and in the claims, the terms "include", "comprise" and "have" are used in an open-ended fashion, and thus should be interpreted to mean "include, but not limited to . . . ". Thus, when the terms "include", "comprise" and/or "have" are used in the description of the present disclosure, the corresponding features, areas, steps, operations and/or components would be pointed to existence, but not limited to the existence of one or a plurality of the corresponding features, areas, steps, operations and/or components.

When the corresponding component such as layer or region is referred to "on another component (or the variant thereof)", it may be directly on this another component, or other component(s) may exist between them. On the other hand, when the component is referred to "directly on another component (or the variant thereof)", any component does not exist between them.

It will be understood that when a component or layer is referred to as being "connected to" another component or layer, it can be directly connected to the another component or layer, or intervening components or layers may be presented. When a component is referred to as being "directly connected to" another component or layer, there are no intervening components or layers presented. In addition, when the component is referred to "be coupled to/with another component (or the variant thereof)", it may be directly connected to this another component, or may be indirectly connected (electrically connected) to this another component through other component(s).

The terms "about", "substantially", "equal", or "same" generally mean within 20% of a given value or range, or mean within 10%, 5%, 3%, 2%, 1%, or 0.5% of a given value or range.

Although terms such as first, second, third, etc., may be used to describe diverse constituent elements, such constituent elements are not limited by the terms. These terms are used only to discriminate a constituent element from other constituent elements in the specification, and these terms have no relation to the manufacturing order of these constituent components. The claims may not use the same terms, but instead may use the terms first, second, third, etc. with respect to the order in which an element is claimed. Accordingly, in the following description, a first constituent element may be a second constituent element in a claim.

It should be noted that the technical features in different embodiments described in the following can be replaced, recombined, or mixed with one another to constitute another embodiment without departing from the spirit of the present disclosure.

In the present disclosure, the electronic device (e.g., a rollable electronic device) may include a rollable display device, a rollable touch display device, a rollable light emitting device, a rollable antenna device, a rollable sensing device, a rollable tiled device or any other suitable electronic device, but not limited thereto. The electronic device may include an organic light-emitting diode (OLED), a light-emitting diode (LED) such as a micro-LED and/or a mini-LED, quantum dots (QDs) material, a quantum-dot light-emitting diode (QLED, QDLED), fluorescence material, phosphor material, other suitable material or a combination thereof, but not limited thereto. In order to explain exemplarily, the electronic device of the present disclosure may be a rollable display device as an example, but not limited thereto. In addition, the electronic device may be a color display device or a monochrome display device, and a shape of the electronic device may be a rectangle, a circle, a polygon, a shape having a curved edge or other suitable shape. In the present disclosure, the shape of the rollable display device may be a rectangle, and the rollable display device may be a color display device, but not limited thereto.

Figure 2:
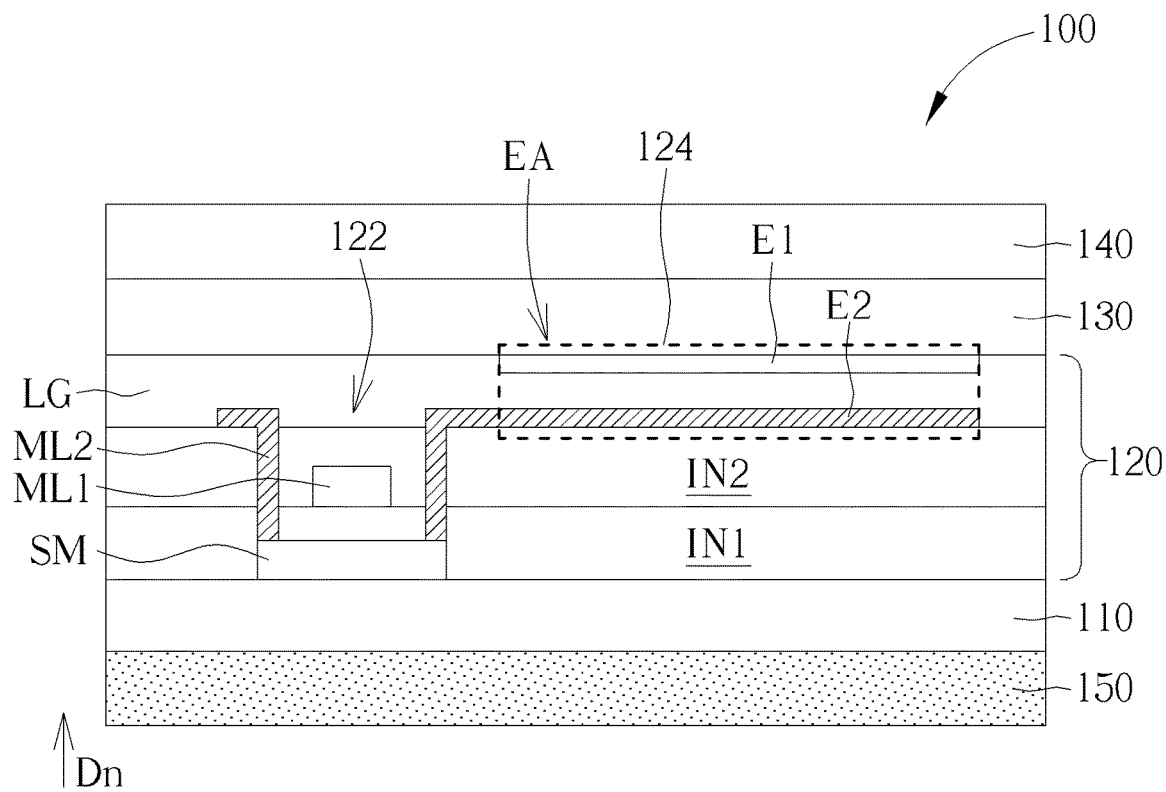
FIG. 2 is a schematic diagram showing a cross-sectional view of the electronic device according to the first embodiment of the present disclosure.

Referring to FIG. 1 and FIG. 2, FIG. 1 is a schematic diagram showing an electronic device according to a first embodiment of the present disclosure, and FIG. 2 is a schematic diagram showing a cross-sectional view of the electronic device according to the first embodiment of the present disclosure, wherein FIG. 2 only shows a region corresponding to one sub-pixel. As shown in FIG. 1, the electronic device 100 (such as a rollable electronic device and/or a rollable display device, etc.) may be rolled to be a roller type, and the electronic device 100 may be stretched along an unrolled direction Du when the electronic device 100 needs to be used, so as to operate the corresponding use of the electronic device 100 (e.g., displaying), wherein the unrolled direction Du and a rolled direction Dr may be opposite. For instance, as shown in FIG. 1, when the stretch of the electronic device 100 is performed, the electronic device 100 may include a rolled portion RP and an unrolled portion UP. In other words, the rolled portion RP is in a rolled status TP1, and the unrolled portion UP is in an unrolled status TP2 (referring to FIG. 14). In some embodiments (as shown in FIG. 1), the shape of the electronic device 100 may be a rectangle, the electronic device 100 may have such as two opposite longitudinal sides PS and two opposite horizontal sides HS, but not limited thereto. The unrolled direction Du and/or the rolled direction Dr of the electronic device 100 may be parallel to the longitudinal side PS of the electronic device 100 substantially, but not limited thereto. In some embodiments, the longitudinal side PS of the electronic device 100 may be a long side, and the horizontal side HS may be such as a short side, but not limited thereto.

As shown in FIG. 1 and FIG. 2, the electronic device 100 includes a substrate 110, a circuit component layer 120 and a deformable structure 150, and the electronic device 100 may optionally include an encapsulation layer 130 and/or a covering layer 140. For example, the circuit component layer 120, the encapsulation layer 130 and the covering layer 140 may be disposed on the substrate 110 in sequence, but not limited thereto. In some embodiments (as shown in FIG. 1 and FIG. 2), the deformable structure 150 may be disposed on a side of the substrate 110 opposite to the circuit component layer 120. That is to say, the circuit component layer 120 and the deformable structure 150 may be disposed on different sides of the substrate 110, but not limited thereto. The position of the deformable structure 150 may be designed based on requirement(s). In the following, the components and the structures are described in detail. The substrate 110 and the covering layer 140 may include a flexible substrate or a soft substrate, and the material of the substrate 110 and/or the material of the covering layer 140 may include polyimide (PI), polyethylene terephthalate (PET), other suitable material or a combination thereof, but not limited thereto. In some embodiments, the covering layer 140 and/or the encapsulation layer 130 may be configured to protect the circuit component layer 120 to reduce the physical damage/influence, the chemical damage/influence and/or the damage/influence caused by water/oxygen on the circuit component layer 120.

Corresponding component(s) and structure(s) are formed in the circuit component layer 120 based on the type of the electronic device 100. For instance, the electronic device 100 may be a rollable display device, and the circuit component layer 120 may include a plurality of pixels PX to display an image, but not limited thereto. In some embodiments, the pixel PX may contain a plurality of sub-pixels arranged alongside; the pixel PX may include a green sub-pixel, a red sub-pixel, a blue sub-pixel, a yellow sub-pixel and/or other color sub-pixel, but not limited thereto. In some embodiments (as shown in FIG. 1), the pixel PX may include three sub-pixels, such as the green sub-pixel SPX1, the red sub-pixel SPX2 and the blue sub-pixel SPX3, and these sub-pixels are arranged in array, but not limited thereto. Note that the pixels PX, the sub-pixels and the arrangement of the pixels PX may be designed based on requirement (s). In some embodiments (as shown in FIG. 1 to FIG. 2), when the electronic device is a display device, in the top-view direction of the electronic device 100 (i.e., a normal direction Dn of the substrate 110), a shape of a light-emitting region EA of the sub-pixel may include a rectangle, a parallelogram, a ">" shape or any suitable shape. For instance, the shape of the sub-pixel shown in FIG. 1 is a rectangle. In addition, a shape of the electronic device 100 may be a rectangle, a circle, a polygon, a shape having a curved edge or other suitable shape. Note that the normal direction Dn of the substrate 110 represents that a normal direction of the unrolled portion UP of the substrate 110.

In FIG. 2, each sub-pixel may include at least one switching component 122 and at least one light emitting unit 124, and each sub-pixel may optionally include another needed component (e.g., a driving transistor, a reset transistor and/or a capacitor, but not limited thereto). The switching component 122 may be such as a thin film transistor, the light emitting unit 124 may include an organic light-emitting diode (OLED), a light-emitting diode (LED) such as a micro-LED and/or a mini-LED, quantum dots (QDs) material, a quantum-dot light-emitting diode (QLED, QDLED), fluorescence material, phosphor material, other suitable material or a combination thereof, but not limited thereto. For instance, the light emitting unit 124 of this embodiment may be an OLED to explain. The circuit component layer 120 further includes any other suitable component(s), such as data lines (or read lines), scan lines and/or other power lines, but not limited thereto. Note that the data line and the scan line may be electrically connected to the light emitting unit 124.

In some embodiments, a channel structure of the switching component 122 may be formed of a semiconductor SM, a gate insulating layer may be formed of an insulating layer IN1, a gate may be formed of a conductive layer ML1 (such as a metal conductive layer), a source and/or a drain may be formed of a conductive layer ML2 (such as a metal conductive layer), and the conductive layer ML1 and the conductive layer ML2 are separated from each other by an insulating layer IN2, but not limited thereto. In some embodiments, the light emitting unit 124 may include an electrode E1, an electrode E2 and a luminescent layer LG between the electrode E1 and the electrode E2, and the luminescent layer LG emits a light based on signals of the electrode E1 and the electrode E2. Note that the luminescent layer LG emits the light only in a region overlapped with and corresponding to the electrode E1 and the electrode E2 (e.g., a region overlapped with the electrode E1 and the electrode E2 in the normal direction Dn of the substrate 110).

The electronic device 100 may optionally include other needed layer(s) or structure(s) to enhance the quality of the electronic device 100. For example, the electronic device 100 may optionally include a light shielding layer, and the light shielding layer may include black ink, black metal, black resin, other suitable light-shielding material or a combination thereof, so as to reduce phenomenon that an outside light is reflected by the structure(s) or component(s) in the normal direction Dn of the substrate 110 (as shown in FIG. 2), thereby enhancing the quality of the electronic device 100, wherein the structure(s) or component(s) may be the switching component 122, a controlling circuit (not shown in FIG. 1 and FIG. 2) and/or traces (not shown in FIG. 1 and FIG. 2). Moreover, the light shielding layer may a plurality of openings, each opening is corresponding to the sub-pixel to define the light-emitting region EA of the sub-pixel, but not limited thereto. A light color converting layer may be correspondingly disposed in the electronic device 100 based the type of the light emitted by the light emitting unit 124, and the light color converting layer may include color filter (e.g., colored photoresist), quantum dots (QD), fluorescence material, phosphorescence material, other suitable material or a combination thereof, such that the light color converting layer may be configured to make the color of the light passing through the light color converting layer be converted into another color.

Note that, the electronic device may have a light emitting layer EL defined by the light-emitting regions EA of all sub-pixels (e.g., SPX1, SPX2 and SPX3). In other words, an edge of the light emitting layer EL is defined by the edges of the light-emitting regions EA of the outermost sub-pixels (e.g., SPX1, SPX2 and SPX3) in the electronic device 100 (as shown in FIG. 1), and the light emitting layer EL may be a smallest rectangle containing the light-emitting regions EA of all of the sub-pixels (e.g., SPX1, SPX2 and SPX3). Note that the range of the light emitting layer EL may be determined under the condition that the electronic device 100 is in the unrolled status TP2, but not limited thereto.

In some embodiments, a Young's modulus of the deformable structure 150 may be changed based on requirement(s). For example, when the electronic device 100 performs to be unrolled, a Young's modulus of the deformable structure 150 in the unrolled portion UP may be increased, such that the Young's modulus of the unrolled portion UP (i.e., containing the deformable structure 150 and other structure(s)) is enhanced to decrease wrinkles in the electronic device 100 and increase the quality of the electronic device 100. In addition, when the electronic device 100 performs to be rolled, the Young's modulus of the deformable structure 150 may be decreased, the Young's modulus of the unrolled portion UP (i.e., containing the deformable structure 150 and other structure (s)) is reduced to make the electronic device 100 be rolled easier, thereby increasing the flexible property and the life of the electronic device 100. Note that the deformable structure 150 may be disposed at any suitable position in the electronic device 100, and the deformable structure 150 may be disposed by adhering, bonding or other suitable disposed method. Alternatively, the deformable structure 150 may be embedded in some layers in the electronic device 100. In some embodiments, as shown in FIG. 2, the deformable structure 150 is disposed on a side of the substrate 110 away from the circuit component layer 120; that is to say, the substrate 110 is situated between the circuit component layer 120 and the deformable structure 150, but not limited thereto. In some embodiments (not shown in figures), for instance, the deformable structure 150 may be disposed on a side of the substrate 110 close to the circuit component layer 120; that is to say, the deformable structure 150 may be disposed between the circuit component layer 120 and the substrate 110, or at least a portion of the deformable structure 150 is disposed in the circuit component layer 120, but not limited thereto.

Figure 3:
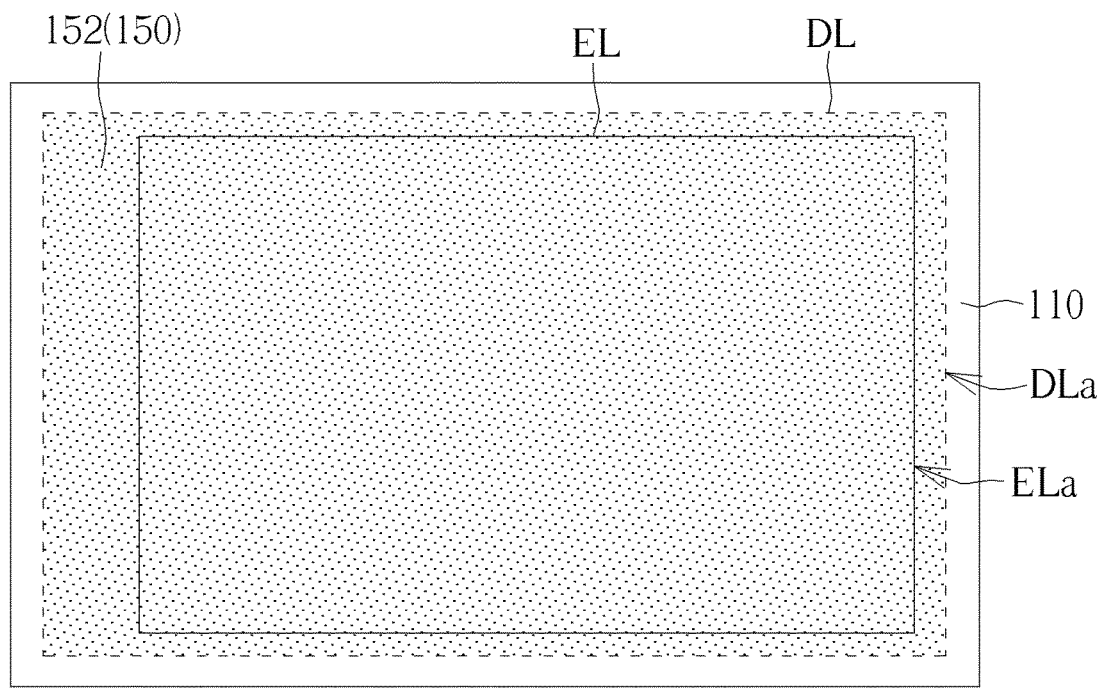
FIG. 3 is a schematic diagram showing a top view of a relation between a light emitting layer and a deformable layer according to an embodiment of the present disclosure.
Figure 4:
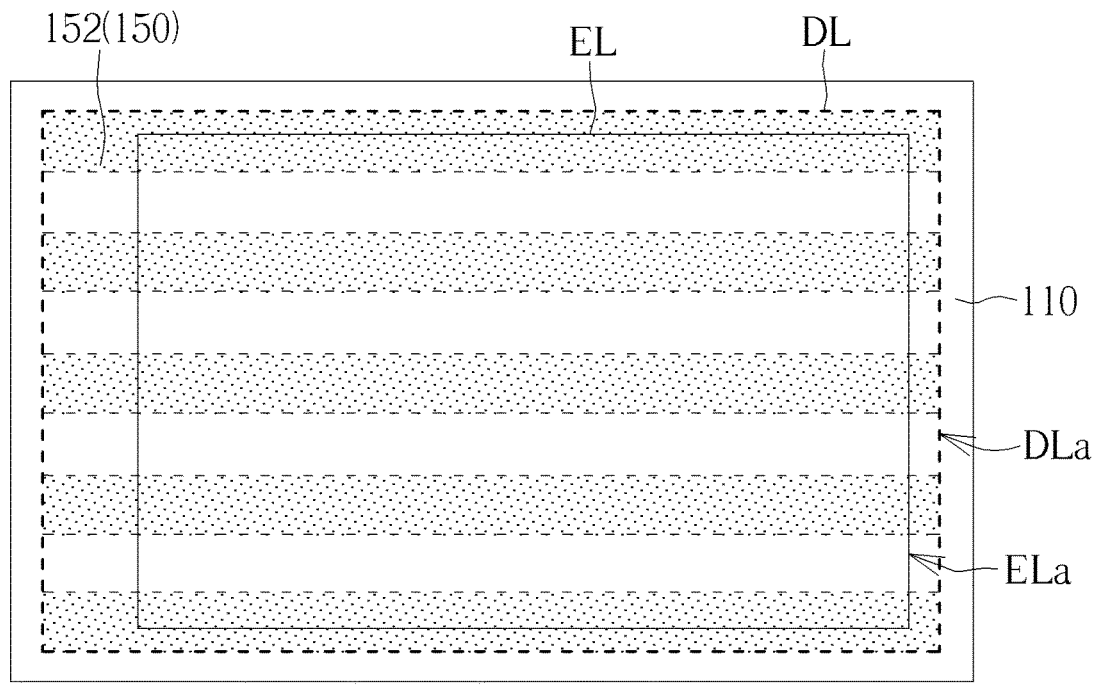
FIG. 4 is a schematic diagram showing a top view of a relation between a light emitting layer and a deformable layer according to another embodiment of the present disclosure.
Figure 5:
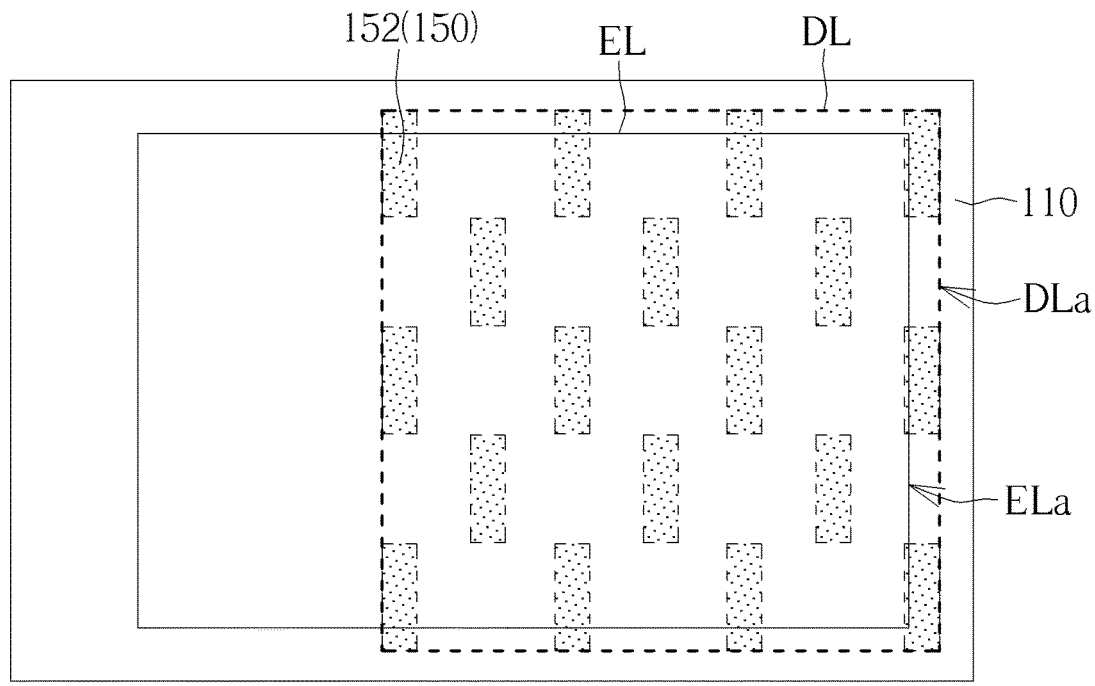
FIG. 5 is a schematic diagram showing a top view of a relation between a light emitting layer and a deformable layer according to another embodiment of the present disclosure.

In some embodiments (as shown in FIG. 3 to FIG. 5), the deformable structure 150 may include at least one deformable unit 152, the deformable unit 152 may have deformable material. In some embodiments, in the normal direction Dn of the substrate 110, a projected profile of the deformable unit 152 may have any suitable shape, such as a rectangle, a circle, a ellipse, a polygon, a shape having a curved edge or other suitable shape, and the arrangement and/or the disposition of the deformable unit 152 may be adjusted based on requirement(s). In some embodiments, a deformable layer DL may be defined by a region containing all of the deformable unit(s) 152, wherein the range of the deformable layer DL may be defined as "a smallest rectangle containing all of the deformable unit(s) 152 in the normal direction Dn of the substrate 110 (i.e., in the top view)". For example, referring to FIG. 3 to FIG. 5 which respective show a top view of a relation between the light emitting layer EL and the deformable layer DL according to different embodiments, FIG. 3 to FIG. 5 shows the completely unrolled electronic device 100, and the rolled direction Dr and the unrolled direction Du of the electronic device 100 are shown, but some components are omitted to make figures clear. In FIG. 3, the deformable structure 150 has one rectangular deformable unit 152, and the range of the deformable layer DL substantially the same as the range of the region of the deformable unit 152, but not limited thereto. In FIG. 4 and FIG. 5, the deformable structure 150 may have a plurality of deformable units 152, and the deformable units 152 are strips, but not limited thereto. As shown in FIG. 4, the deformable units 152 may extend along the unrolled direction Du and arranged along a direction perpendicular to the unrolled direction Du, but not limited thereto. In some embodiments, as shown in FIG. 5, for instance, the deformable units 152 may be arranged in staggered arrangement. Note that the deformable units 152 shown in the figures are arranged regularly, but the deformable unit 152 may be arranged randomly in another embodiment (not shown in the figures). The deformable layer DL shown in FIG. 4 and FIG. 5 may be a smallest rectangle containing all of the deformable units 152, and the deformable layer DL are shown by a coarse dash line in FIG. 4 and FIG. 5. In some embodiments, the deformable structure 150 may have at least one deformable unit 152, and an area of the deformable layer DL projected on the substrate 110 may be the same as the substrate 110. In some embodiments (not shown in figures), the shape of the deformable unit 152 in top view is a X-shape or other shape, the range of the deformable layer DL may be defined by a smallest rectangle containing the deformable unit 152.

In an embodiment, an edge of the deformable layer DL is at least aligned with an edge of the light emitting layer EL in the unrolled direction Du, so as to support the unrolled portion UP. In the above, the edge of the light emitting layer EL is an edge farthest from the rolled portion RP (thereafter, this edge of the light emitting layer EL is referred to as a stretching edge ELa of the light emitting layer EL). Similarly, in the above, the edge of the deformable layer DL is an edge farthest from the rolled portion RP (thereafter, the edge of the deformable layer DL is referred to as a stretching edge DLa of the deformable layer DL). Note that, "the first edge is aligned with the second edge" described herein represents the first edge and the second edge substantially overlap in the normal direction Dn of the substrate 110, wherein the first edge can be considered as being aligned with the second edge when an alignment error between the first edge and the second edge is less than 1 mm (e.g., 10 μm). Note that, "the first edge is at least aligned with the second edge in the unrolled direction Du" described herein is that the first edge is substantially aligned with the second edge or the first edge extends beyond the second edge in the unrolled direction Du.

In some embodiments, the deformable layer DL and the light emitting layer EL may be different layers, during the rolling process and/or the stretching process, a dislocation may occur between the deformable layer DL and the light emitting layer EL along the unrolled direction Du (or the rolled direction Dr). Accordingly, in order to make the stretching edge DLa of the deformable layer DL in the unrolled portion UP be at least aligned with the stretching edge ELa of the light emitting layer EL in the unrolled direction Du, the dislocation occurring during the rolling process and/or the stretching process needs to be considered when designing the range of the light emitting layer EL and the deformable layer DL, but not limited thereto. For instance, in FIG. 3 to FIG. 5, the electronic device 100 is in the unrolled status, the stretching edge DLa of the deformable layer DL may extend beyond the stretching edge ELa of the light emitting layer EL in the unrolled direction Du, but not limited thereto.

Moreover, the top view relation between other edges of the deformable layer DL (i.e., the edges except for the stretching edge DLa) and other edges of the light emitting layer EL (i.e., the edges except for the stretching edge ELa) are not limited. For example, in FIG. 3 and FIG. 4, under the condition that the electronic device 100 is in the unrolled status, in the normal direction Dn of the substrate 110 (the top view of the electronic device 100), all edges of the light emitting layer EL are situated inside the deformable layer DL (i.e., a projected profile of the light emitting layer EL on the substrate 110 may be situated inside a projected profile the deformable layer DL on the substrate 110), but not limited thereto. In some embodiments (as shown in FIG. 5), in the normal direction Dn of the substrate 110, an upper edge and a lower edge of the deformable layer DL (i.e., two edges connected to the stretching edge DLa) may extend beyond an upper edge and a lower edge of the light emitting layer EL (i.e., two edges connected to the stretching edge ELa), and a left edge of the deformable layer DL (i.e., an edge far from the stretching edge DLa) may not extend beyond an left edge of the light emitting layer EL (i.e., an edge far from the stretching edge ELa), but not limited thereto. In some embodiments (not shown in figures), in the normal direction Dn of the substrate 110, the upper edge, the lower edge and/or the left edge of the light emitting layer EL may extend beyond the upper edge, the lower edge and/or the left edge of the deformable layer DL. In some embodiments (not shown in figures), in the normal direction Dn of the substrate 110, the upper edge, the lower edge and/or the left edge of the deformable layer DL may extend beyond the upper edge, the lower edge and/or the left edge of the light emitting layer EL. Note that when the electronic device 100 is rolled or stretched, the top view relation between the edges of the deformable layer DL and the edges of the light emitting layer EL may be changed or not be changed. Moreover, under the condition of different unrolled ratios of the electronic device 100, the top view relation between the deformable layer DL and the light emitting layer EL of the unrolled portion UP may be changed or not be changed.

Figure 6:
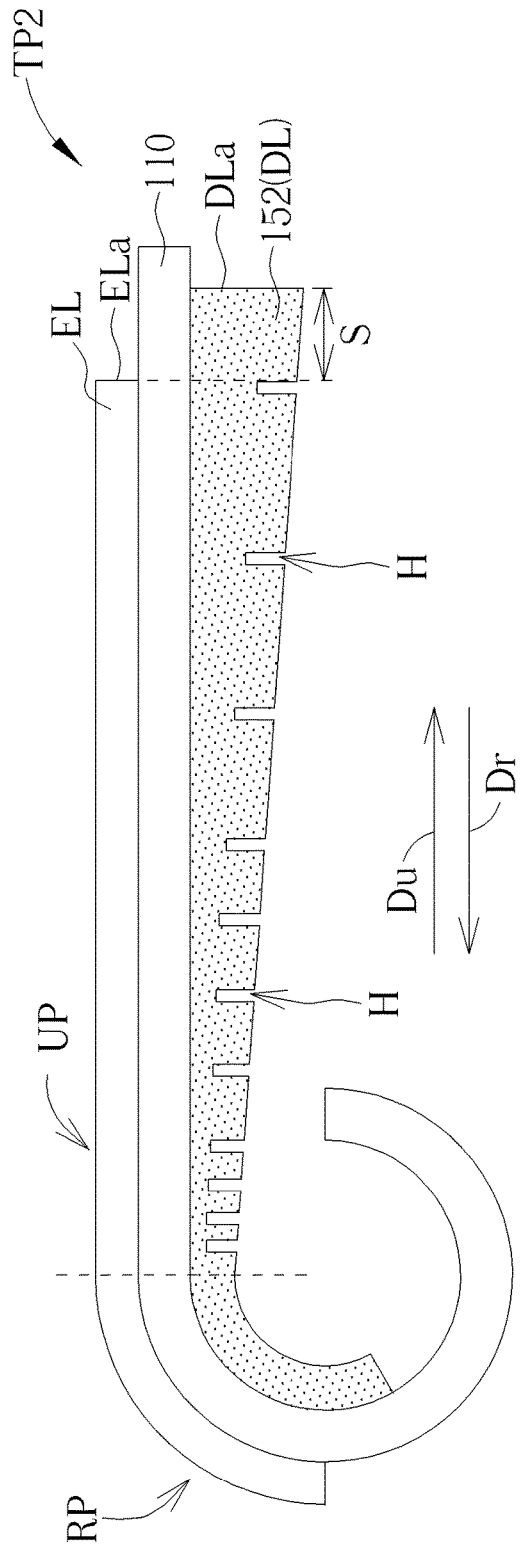
FIG. 6 is a schematic diagram showing a cross-sectional view of an electronic device in an unrolled status according to an embodiment of the present disclosure.
Figure 7:
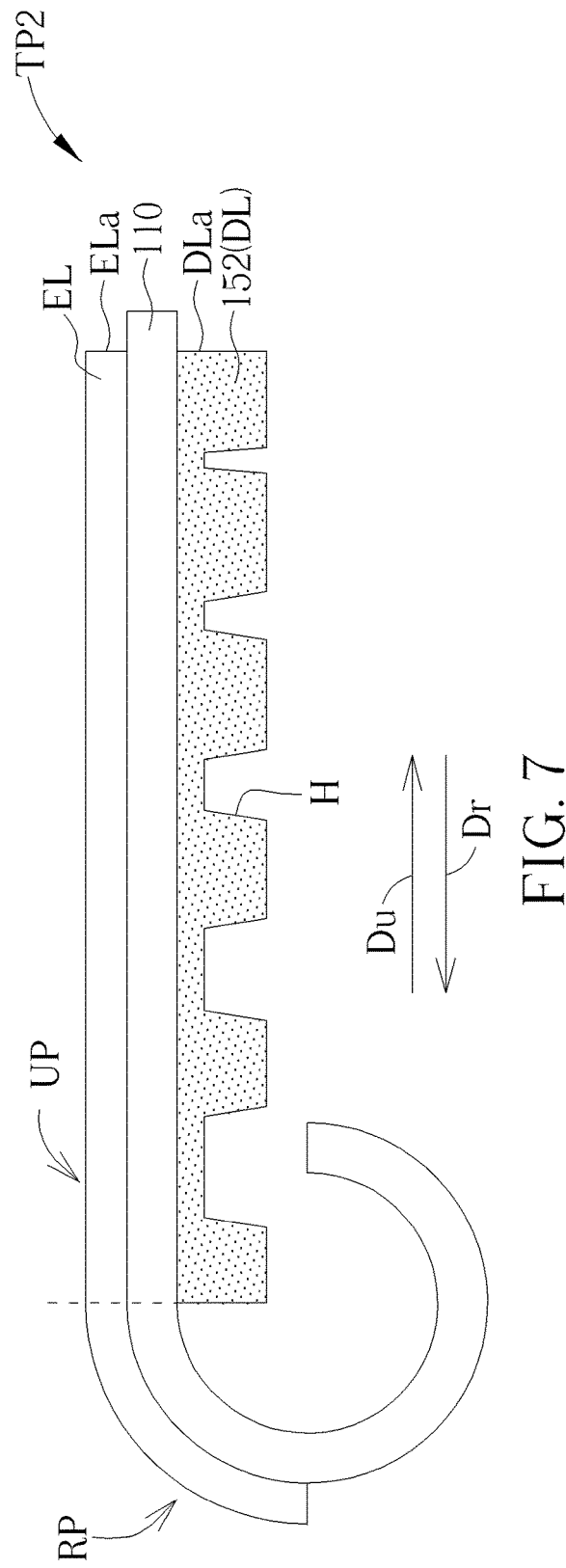
FIG. 7 is a schematic diagram showing a cross-sectional view of an electronic device in an unrolled status according to another embodiment of the present disclosure.
Figure 8:
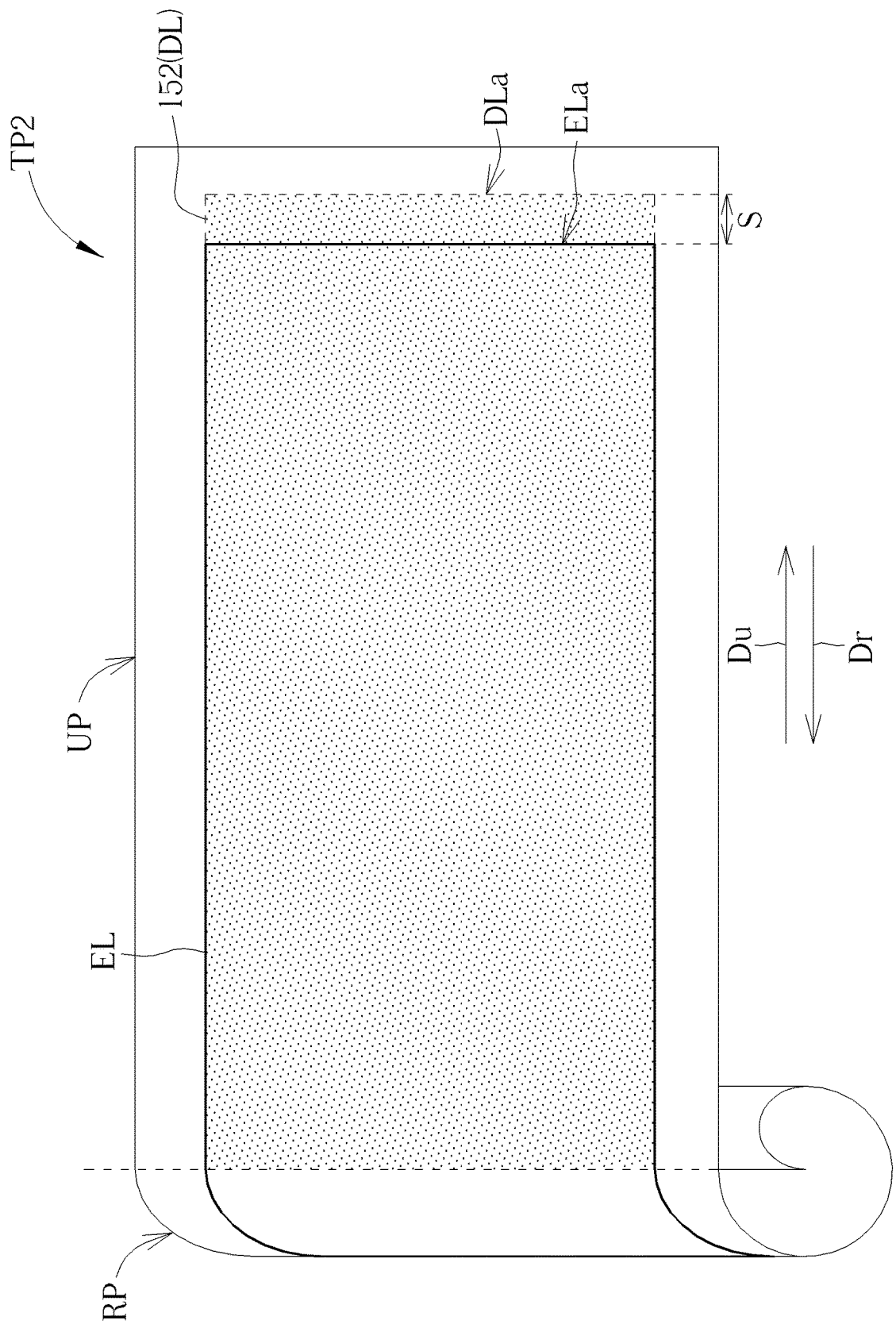
FIG. 8 is a schematic diagram showing a top view of an electronic device in an unrolled status according to another embodiment of the present disclosure.

Referring to FIG. 6 to FIG. 8, FIG. 6 is a schematic diagram showing a cross-sectional view of an electronic device in an unrolled status according to an embodiment of the present disclosure, FIG. 7 is a schematic diagram showing a cross-sectional view of an electronic device in an unrolled status according to another embodiment of the present disclosure, and FIG. 8 is a schematic diagram showing a top view of an electronic device in an unrolled status according to another embodiment of the present disclosure, wherein FIG. 6 to FIG. 8 only show the relation of the substrate 110, the light emitting layer EL and the deformable layer DL, and the range of the light emitting layer EL in FIG. 8 are shown by a coarse line. In some embodiments, as shown in FIG. 6, for instance, the stretching edge DLa of the deformable layer DL may extend beyond the stretching edge ELa of the light emitting layer EL in the unrolled direction Du, and the rolled portion RP in the unrolled status TP2 may have a portion of the deformable layer DL, but not limited thereto. In some embodiments, as shown in FIG. 7, for example, the stretching edge DLa of the deformable layer DL may be substantially aligned with (or overlapped with) the stretching edge ELa of the light emitting layer EL, and the rolled portion RP in the unrolled status TP2 may not have the deformable layer DL, but not limited thereto. In some embodiments, as shown in FIG. 8, for instance, the stretching edge DLa of the deformable layer DL may extend beyond the stretching edge ELa of the light emitting layer EL in the unrolled direction Du, and the rolled portion RP in the unrolled status TP2 may not have the deformable layer DL.

In order to decrease the manufacturing deviation and/or the dislocation generated by the displacement of layer(s) (e.g., the dislocation caused by being rolled and stretched) which affect the deformable structure 150 to making the hardness of the unrolled portion UP insufficient, the stretching edge DLa of the deformable layer DL may be designed to extend beyond the stretching edge ELa of the light emitting layer EL in the unrolled direction Du. In some embodiments, a distance S between the stretching edge DLa of the deformable layer DL and the stretching edge ELa of the light emitting layer EL (as shown in FIG. 6 and FIG. 8) may be greater than 1 mm, but not limited thereto. In some embodiments, the distance S between the stretching edge DLa and the stretching edge ELa is greater than 1 mm, but not limited thereto. For instance, the aforementioned distance S may be a maximum distance between the stretching edge DLa and the stretching edge ELa in the unrolled direction Du measured under the condition that the electronic device 100 in the unrolled status TP2.

In some embodiments (as shown in FIG. 6 and FIG. 7), thicknesses (and/or volumes) of different regions of the deformable layer DL in the unrolled portion UP may be different. For instance, the thickness (and/or the volume) of the deformable layer DL in the unrolled portion UP close to the rolled portion RP is different from the thickness (and/or the volume) of the deformable layer DL in the unrolled portion UP far from the rolled portion RP. In some embodiments (as shown in FIG. 6 and FIG. 7), in the unrolled status TP2, the thickness (and/or the volume) of the deformable layer DL in the unrolled portion UP close to the rolled portion RP may be less than the thickness (and/or the volume) of the deformable layer DL in the unrolled portion UP far from the rolled portion RP. In some embodiments (as shown in FIG. 6 and FIG. 7), in the unrolled status TP2, the thickness (and/or the volume) of the deformable layer DL in the unrolled portion UP may be decreased with proximity of the rolled portion RP, but not limited thereto.

In some embodiments (as shown in FIG. 6), the deformable layer DL may have a plurality of holes H, a number (and/or a density) of the holes H of the deformable layer DL in the unrolled portion UP close to the rolled portion RP may be different from a number (and/or a density) of the holes H of the deformable layer DL in the unrolled portion UP far from the rolled portion RP. In some embodiments (as shown in FIG. 6), for example, the number (and/or the density) of the holes H of the deformable layer DL in the unrolled portion UP close to the rolled portion RP may be greater than the number (and/or the density) of the holes H of the deformable layer DL in the unrolled portion UP far from the rolled portion RP. For example, in FIG. 6, the density of the holes H of the deformable layer DL is increased with proximity of the rolled portion RP. In other words, a density of the deformable layer DL in the unrolled portion UP is decreased with proximity of the rolled portion RP.

Note that depths, diameters and/or shapes of the holes H may be designed based on requirement(s). For example, the holes H may have the same depth or different depths, and/or may have the same diameter or different diameters (as shown in FIG. 6 or FIG. 7). As another example, in FIG. 7, the thickness of the deformable layer DL is substantially the same, and the diameters of the holes H of the deformable layer DL (e.g., maximum widths of the holes H in the unrolled direction Du) may be increased with proximity of the rolled portion RP, but not limited thereto. Note that, "a component is changed (e.g., be increased or decreased) with proximity of the rolled portion RP" described above is not limited to changes in equal proportions, it also includes changes in non-equal proportions. According to the aforementioned design, the functionality of the corresponding region of the electronic device 100 may be improved. For instance, the rolled portion RP may have a less hardness or a lower Young's modulus to achieve a better rolled effect, and the unrolled portion UP may have a greater hardness or a greater Young's modulus to achieve a better supporting effect, but not limited thereto.

In some embodiments, in the normal direction Dn of the substrate 110 (in top view), a ratio of an area of the light emitting layer EL to an area of the deformable layer DL may range from 0.4 to 1.4 ($0.4 \leq ratio \leq 1.4$), from 0.7 to 1.4 ($0.7 \leq ratio \leq 1.4$), from 0.8 to 1.3 ($0.8 \leq ratio \leq 1.3$) or from 0.9 to 1.2 ($0.9 \leq ratio \leq 1.2$), but not limited thereto. In some embodiments, in the unrolled direction Du, a ratio of a maximum length of the light emitting layer EL to a maximum length of the deformable layer DL may range from 0.4 to 1.3 ($0.4 \leq ratio \leq 1.3$), from 0.7 to 1.4 ($0.7 \leq ratio \leq 1.4$), from 0.8 to 1.3 ($0.8 \leq ratio \leq 1.3$) or from 0.9 to 1.2 ($0.9 \leq ratio \leq 1.2$), but not limited thereto.

In some embodiments, as shown in FIG. 6, in the normal direction Dn of the substrate 110, the light emitting layer EL in the rolled portion RP may partially overlap the deformable layer DL. In some embodiments, as shown in FIG. 8, in the normal direction Dn of the substrate 110, the light emitting layer EL in the rolled portion RP may not overlap the deformable layer DL.

In some embodiments, an area of the deformable layer DL in the unrolled portion UP may be greater than or equal to an area of the light emitting layer EL in the unrolled portion UP, such that the deformable structure 150 may provide the unrolled portion UP with a suitable support.

In some embodiments, the deformable unit 152 may be deformable by temperature, electric, magnetic force, pressure or a combination thereof. By above method(s), the Young's modulus of the deformable layer DL in the unrolled portion UP may be adjusted to be greater than the Young's modulus of the deformable layer DL in the rolled portion RP, so as to provide the unrolled portion UP with the suitable supporting force. In addition, under the condition that the user rolls the electronic device 100, the Young's modulus of the deformable layer DL may be decreased to make the electronic device 100 be rolled to be in the rolled status TP1 easily. A transforming method will be described in detail below, but the transforming method is not limited by the below content.

Note that, the Young's modulus of the unrolled portion UP may be obtained by measuring an overall Young's modulus of all layers in the unrolled portion UP. Furthermore, the Young's modulus of the rolled portion RP may be obtained by measuring an overall Young's modulus of all layers in the rolled portion RP, but not limited thereto.

Figure 9:
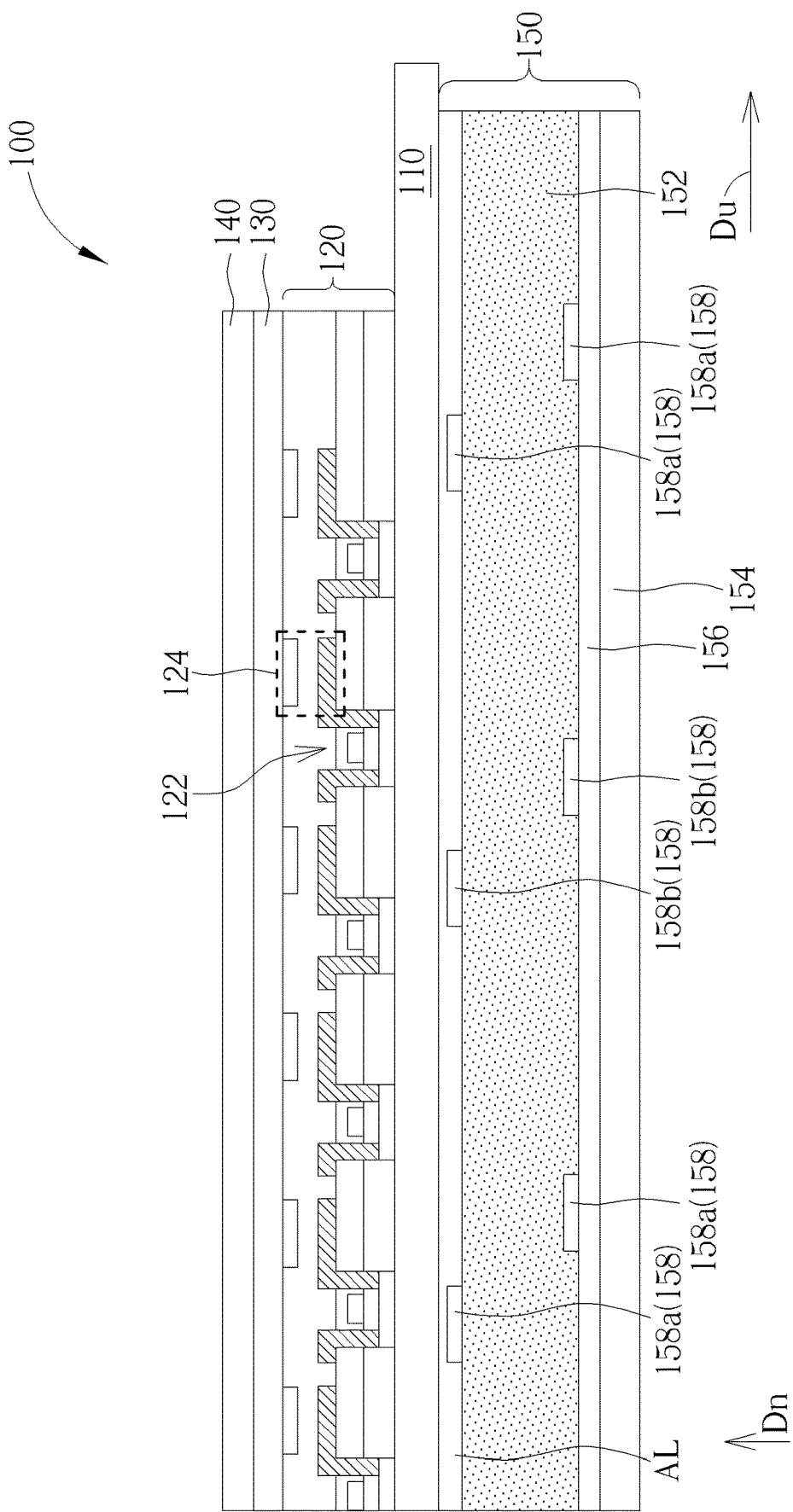
FIG. 9 is a schematic diagram showing a cross-sectional view of the electronic device according to the first embodiment of the present disclosure.
Figure 10:
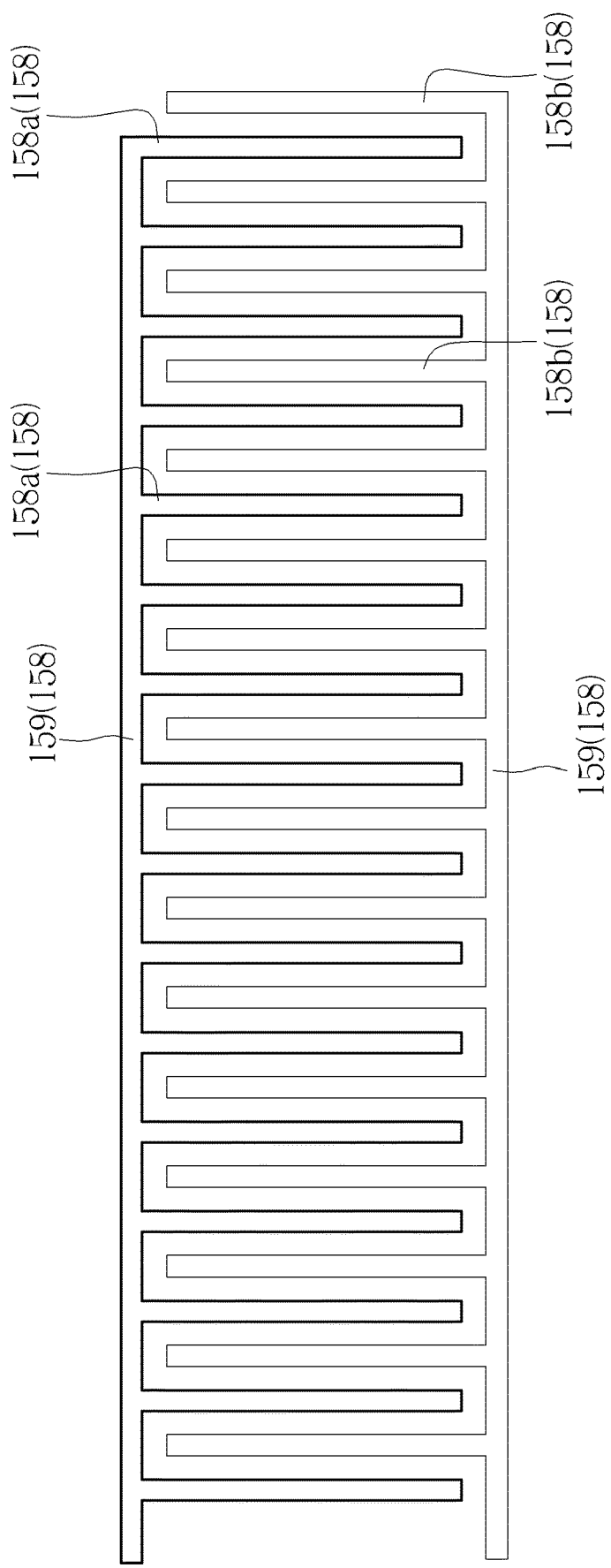
FIG. 10 is a schematic diagram showing top view of controlling electrodes of an electronic device according to an embodiment of the present disclosure.

Referring to FIG. 9 and FIG. 10, FIG. 9 is a schematic diagram showing a cross-sectional view of the electronic device according to the first embodiment of the present disclosure, and FIG. 10 is a schematic diagram showing top view of controlling electrodes of an electronic device according to an embodiment of the present disclosure, wherein FIG. 9 shows a portion of the unrolled portion UP. As shown in FIG. 9, the deformable unit 152 may be deformable electrically for example, and the deformable material may include piezoelectric material such as lead zirconate titanate (Pb(ZrTi)$O_3$), quartz, lithium niobate (LiNbO$_3$), barium titanate (BaTiO$_3$) and/or polyvinylidene fluoride (PVDF), but not limited thereto. In some embodiments, the deformation of the piezoelectric material may be controlled by electric signal(s), the Young's modulus of the corresponding region (e.g., the unrolled portion UP or the rolled portion RP) of the electronic device 100 may be changed.

In some embodiments (as shown in FIG. 9), the deformable structure 150 may include a plurality of controlling electrodes 158, the controlling electrodes 158 may include at least one first controlling electrode 158a and at least one second controlling electrode 158b. As shown in FIG. 9, the controlling electrodes 158 may include a plurality of first controlling electrodes 158a and a plurality of second controlling electrodes 158b, and the deformable unit 152 may be disposed between the first controlling electrodes 158a and the second controlling electrodes 158b for example. In some embodiments (as shown in FIG. 9), some of the first controlling electrodes 158a and some of the second controlling electrodes 158b may be disposed on an upper side of the deformable unit 152 (e.g., a side close to the substrate 110), some of the first controlling electrodes 158a and some of the second controlling electrodes 158b may be disposed on a lower side of the deformable unit 152 (e.g., a side far from the substrate 110), and these first controlling electrodes 158a and these second controlling electrodes 158b may be strip electrodes and be alternately arranged along a direction (e.g., the unrolled direction Du).

In addition, as shown in FIG. 10 which is a schematic diagram showing top view of the controlling electrodes 158 included in the deformable structure 150 of FIG. 9, wherein FIG. 10 only shows the first controlling electrodes 158a and the second controlling electrodes 158b disposed on one side among the upper side and the lower side of the deformable unit 152 for instance. In some embodiments, in FIG. 10, the controlling electrode 158 may further include a plurality of connecting electrodes 159, wherein the first controlling electrodes 158a are electrically connected to each other through one or more of the connecting electrodes 159, and the second controlling electrodes 158b are electrically connected to each other through another or more of the connecting electrodes 159, but not limited thereto. The first controlling electrode 158a and the second controlling electrode 158b are configured to respectively receive different voltages, so as to form a horizontal electric field to adjust the Young's modulus of the deformable layer DL. Note that the dispositions of the first controlling electrodes 158a and the second controlling electrodes 158b are not limited to the above figures. In another embodiment (not shown in figures), the first controlling electrode 158a and the second controlling electrode 158b are configured to respectively receive different voltages for instance, so as to form a vertical electric field or other electric field with suitable direction.

In another embodiment (not shown in figures), the controlling electrode 158 may include a plurality of first controlling electrodes 158a and one second controlling electrode 158b. For example, the plurality of first controlling electrodes 158a and one second controlling electrode 158b may be disposed on the same side of the deformable unit 152 (e.g., the upper side or the lower side), the first controlling electrodes 158a may be strip electrodes and be arranged along a direction (e.g., the unrolled direction Du), the second controlling electrode 158b may be a plane electrode, and the second controlling electrode 158b and the plurality of first controlling electrodes 158a may overlap in the normal direction Dn of the substrate 110. The first controlling electrode 158a and the second controlling electrode 158b may be configured to respectively receive different voltages to form an electric field.

For instance, when a first voltage difference exists between the first controlling electrode 158a and the second controlling electrode 158b, the generated electric field may make the Young's modulus of the corresponding region of the deformable unit 152 (or the deformable layer DL) higher; when a second voltage difference exists between the first controlling electrode 158a and the second controlling electrode 158b, the generated electric field may make the Young's modulus of the corresponding region of the deformable unit 152 (or the deformable layer DL) lower. That is to say, when the electronic device 100 is in the rolled status TP1, the second voltage difference may exist between the first controlling electrode 158a and the second controlling electrode 158b, such that the Young's modulus of the deformable unit 152 (or the deformable layer DL) is lower for maintaining the greater rolled effect; when the electronic device 100 is stretched to be in the unrolled status TP2, the first voltage difference may exist between the first controlling electrode 158a and the second controlling electrode 158b in the unrolled portion UP, the Young's modulus of the deformable unit 152 (or the deformable layer DL) is higher for providing the supporting force.

In some embodiments (not shown in figures), the first controlling electrode 158a and the second controlling electrode 158b may be only disposed on the same side of the deformable unit 152 (e.g., the upper side or the lower side), the first controlling electrode 158a and the second controlling electrode 158b may be configured to respectively receive different voltages to generate horizontal electric field, but not limited thereto.

In some embodiments (not shown in figures), in the normal direction Dn of the substrate 110, the first controlling electrode 158a and the second controlling electrode 158b disposed on different sides of the deformable unit 152 may be aligned with each other (referring to FIG. 16) or be staggered. In FIG. 9, the first controlling electrode 158a and the second controlling electrode 158b disposed on different sides of the deformable unit 152 may be staggered in the normal direction Dn of the substrate 110.

The method for changing the Young's modulus of the deformable layer DL is not limited to the above. For example, the deformable layer DL (or the deformable unit 152) may be deformable by temperature or magnetic force. In some embodiments, the deformable layer DL (or the deformable unit 152) may include material which can deform by heating (e.g., the material may soften by heating), but not limited thereto. For instance, when the greater current passes through the controlling electrode 158, the temperature of the controlling electrode 158 may be enhanced, the deformable layer DL (or the deformable unit 152) deforms (e.g., soften), which decrease the Young's modulus of the deformable layer DL (or the deformable unit 152) for being rolled easily. When less current passes through the controlling electrode 158 (or no current passes through the controlling electrode 158), the temperature of the controlling electrode 158 may be decreased, the deformable layer DL (or the deformable unit 152) is curing and the Young's modulus of the deformable layer DL is enhanced. For another example, the deformable unit 152 may be deformable by magnetic force, and the deformable layer DL (or the deformable unit 152) may include magnetic material.

Figure 11A:
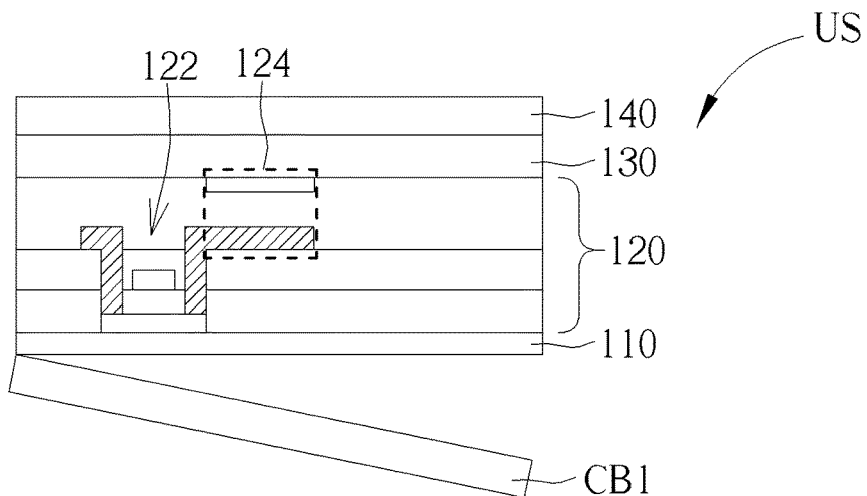
FIG. 11A, FIG. 11B and FIG. 12 are schematic diagrams showing a manufacturing process of an electronic device according to an embodiment of the present disclosure.
Figure 11B:
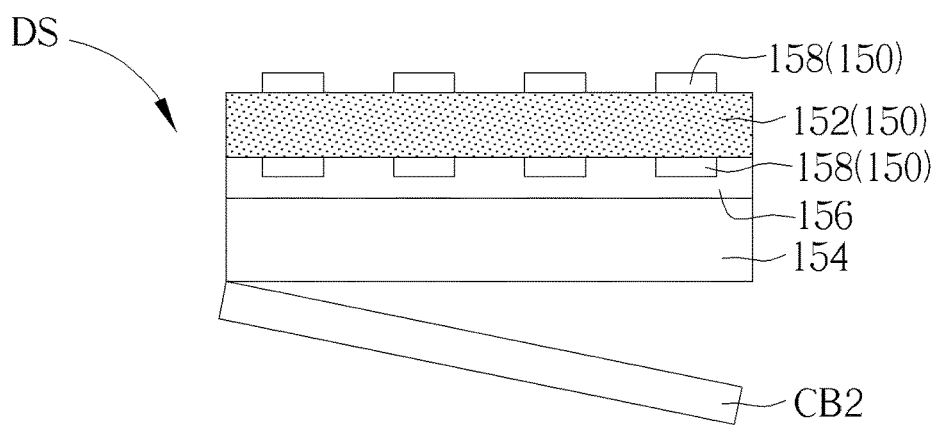
Figure 12:
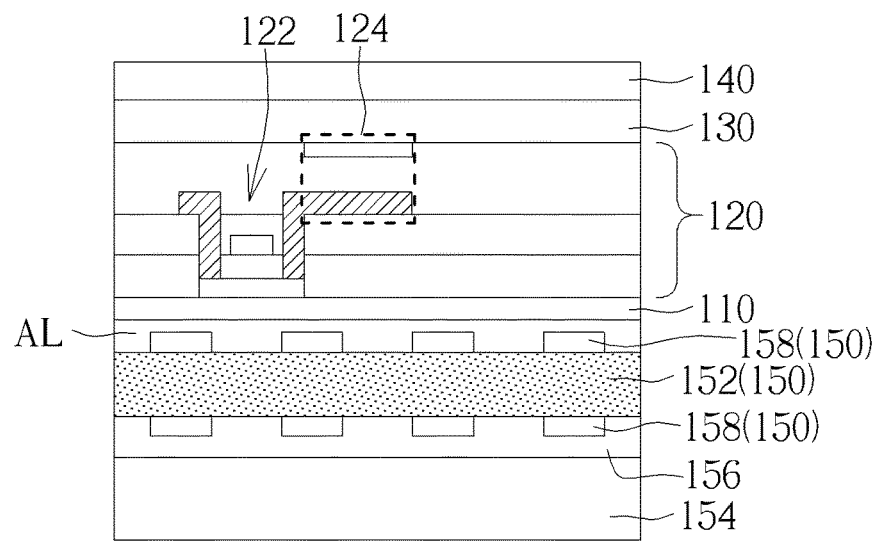

Referring to FIG. 11A, FIG. 11B and FIG. 12, FIG. 11A, FIG. 11B and FIG. 12 are schematic diagrams showing a manufacturing process of an electronic device according to an embodiment. The manufacturing method of the electronic device 100 will be described in the following, but not limited to. Note that the sizes and thickness ratios of the layers/components in the below figures (FIG. 11A to FIG. 12) are for exemplary illustration only. As shown in FIG. 11A and FIG. 11B, the substrate 110, the circuit component layer 120, the encapsulation layer 130 and the covering layer 140 may be disposed on a first carrier board CB1 in sequence to form a top substrate structure US, and a bottom board 154, the insulating layer 156, the controlling electrode 158, the deformable unit 152 and the controlling electrode 158 may be disposed on a second carrier board CB2 in sequence to form a bottom substrate structure DS, but not limited thereto. Next, in FIG. 11A and FIG. 11B, a release process is performed in the top substrate structure US for separating the substrate 110 from the first carrier board CB1, and another release process is performed in the bottom substrate structure DS for separating the bottom board 154 from the second carrier board CB2. As shown in FIG. 12, the deformable structure 150 may be adhered to the substrate 110 by an adhesive layer AL.

In some embodiments (not shown in figures), the controlling electrode 158 in the deformable structure 150 may be electrically connected to the component(s) of the circuit component layer 120. The controlling electrode 158 may be electrically connected to the component(s) of the circuit component layer 120 through a via, or the controlling electrode 158 may be electrically connected to the component(s) of the circuit component layer 120 through an outer connecting circuit. In another manufacturing method (not shown in figures), the bottom substrate structure DS may not have the bottom board 154.

In another manufacturing method (not shown in figures), one layer of the controlling electrodes 158 may be disposed between the substrate 110 and the first carrier board CB1. In other words, two layers of the controlling electrode 158 may be respectively disposed on the first carrier board CB1 and the second carrier board CB2. Then, the deformable structure 150 may be adhered to the substrate 110 by the adhesive layer AL, such that the deformable unit 152 may be controlled by the controlling electrodes 158. In another manufacturing method (not shown in figures), the substrate 110, the circuit component layer 120, the encapsulation layer 130 and the covering layer 140 are stacked on the first carrier board CB1. Then, a release process is performed for separating the substrate 110 from the first carrier board CB1. Finally, the controlling electrodes 158, the deformable structure 150 and the insulating layer 156 are directly formed on the side of the substrate 110 opposite to the circuit component layer 120, but not limited thereto.

Figure 13:
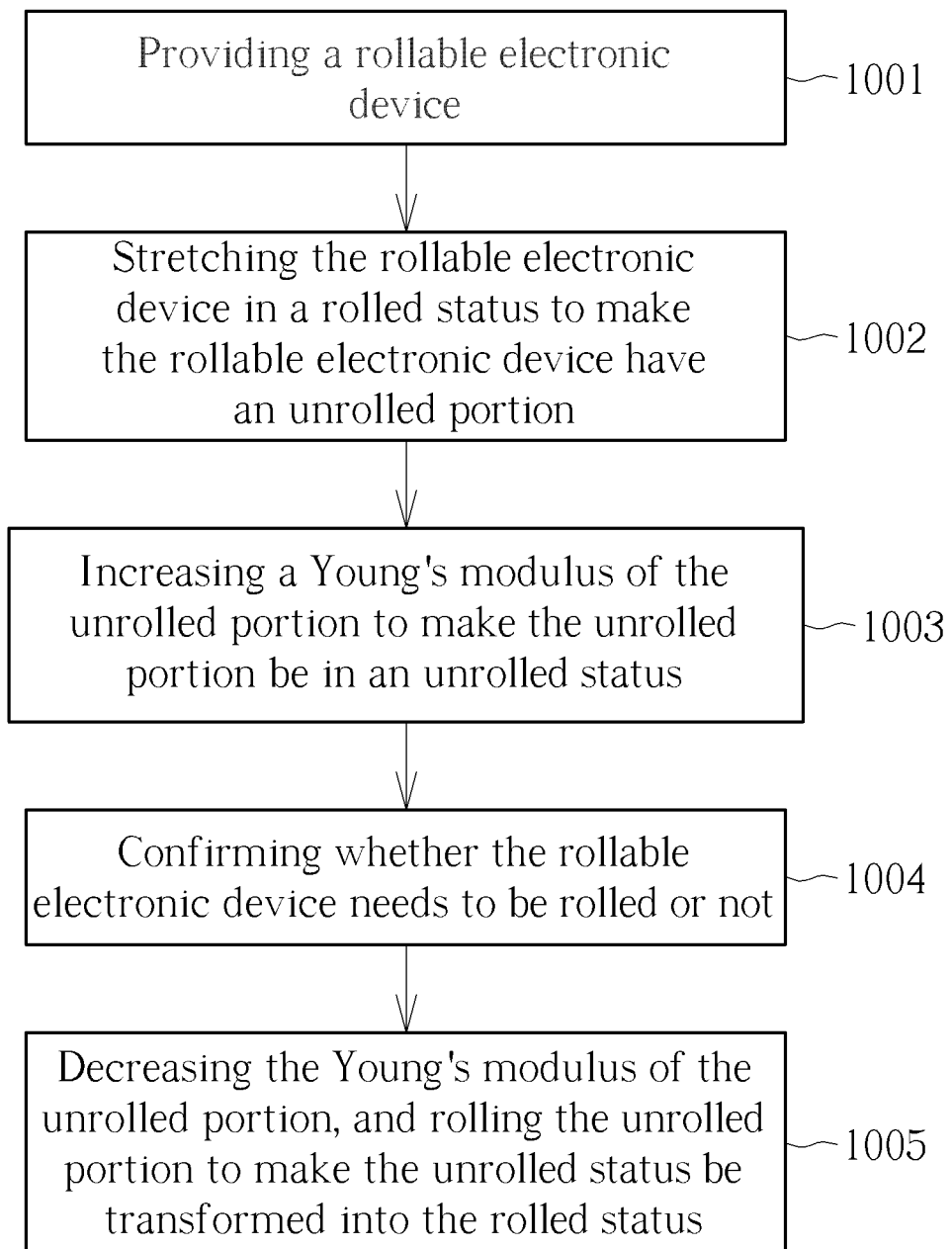
FIG. 13 is a schematic diagram showing a flowchart of a transforming method of a rollable electronic device according to an embodiment of the present disclosure.
Figure 14:
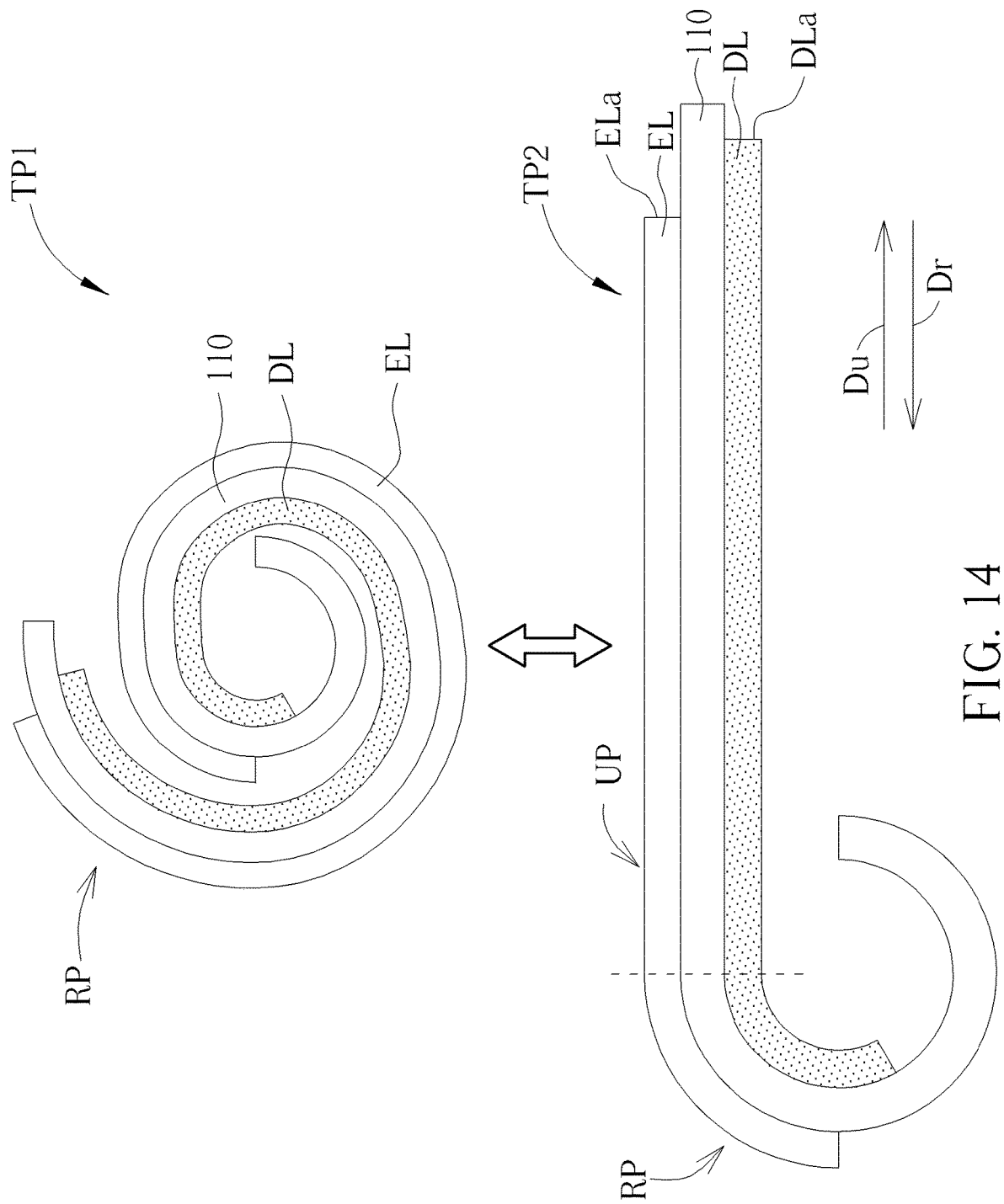
FIG. 14 is a schematic diagram showing two statuses of an electronic device according to an embodiment of the present disclosure.

Referring to FIG. 13 and FIG. 14, FIG. 13 is a schematic diagram showing a flowchart of a transforming method of a rollable electronic device according to an embodiment of the present disclosure, FIG. 14 is a schematic diagram showing two statuses of an electronic device according to an embodiment of the present disclosure, FIG. 14 shows the rolled status TP1 and the unrolled status TP2. In the transforming method, firstly, providing the rollable electronic device (a step 1001). Next, stretching the rollable display device 100 in the rolled status TP1 to make the rollable display device 100 have the unrolled portion UP (a step 1002). Then, increasing the Young's modulus of the unrolled portion UP to make the unrolled portion UP be in the unrolled status TP2 (a step 1003). In the step of stretching the rollable display device 100 in the rolled status TP1, the stretching action may be realized by electric signal(s), user stretching or other suitable method, but not limited thereto. Moreover, in the step of increasing the Young's modulus of the unrolled portion UP to make the unrolled portion UP be in the unrolled status TP2, the step may include performing a detecting operation on the unrolled portion UP. For example, in the detecting operation, when a curvature of the unrolled portion UP reaches a target curvature, the Young's modulus of the unrolled portion UP may be increased to a first target value to make the unrolled portion UP be in the unrolled status TP2. The above detecting operation may detect the curvature of the unrolled portion UP of the electronic device 100 by a curvature detecting unit (referring to FIG. 17) or other sensing circuit (not shown in figures). The curvature detecting unit will be described in detail in the following. In some embodiments, another sensing circuit described above may include trace(s) or capacitor(s), the trace(s) or capacitor(s) disposed on a peripheral circuit area of the rollable electronic device, and the change of the curvature may be detected by calculating a resistance change of the trace or a capacitance change of the capacitor, but not limited thereto. In addition, the method of increasing the Young's modulus (e.g., the Young's modulus may be changed by temperature, electric, magnetic force, pressure or a combination thereof) may be referred to above, and will not be redundantly described. Note that, in some embodiments, the Young's modulus of the unrolled portion UP is increased while the electronic device 100 is stretched, but not limited thereto. In some embodiments, the rollable electronic device 100 is the display device, when the rollable electronic device 100 is in the unrolled status TP2, the rollable electronic device 100 may display an image, but not limited thereto.

After the electronic device 100 is unrolled, a step that confirms whether the electronic device 100 needs to be rolled is performed (a step 1004). If the unrolled portion UP needs to maintain in the unrolled status, the Young's modulus of the deformable layer DL in the unrolled portion UP may substantially maintain at the first target value. If the unrolled portion UP needs to be rolled, the Young's modulus of the deformable layer DL in the unrolled portion UP is decreased to make the unrolled portion UP be rolled easily.

In detail, after confirming that the electronic device 100 needs to be rolled, a step of making the unrolled status TP2 be transformed into the rolled status TP1 is performed (a step 1005). The step 1005 includes decreasing the Young's modulus of the unrolled portion UP, and rolling the unrolled portion UP to make the unrolled status TP2 be transformed into the rolled status TP1. In the above step of decreasing the Young's modulus of the unrolled portion UP, the Young's modulus of the unrolled portion UP may be changed from the first target value to a second target value, wherein the first target value is greater than the second target value.

In some embodiments, the electronic device 100 may optionally include a sensing unit configured to sense the Young's modulus of the corresponding region (i.e., the unrolled portion UP or the rolled portion RP). Note that, the sensing unit (not shown in figures) may be used to confirm whether the Young's modulus of the unrolled portion UP reaches the second target value before rolled. When the Young's modulus of the unrolled portion UP has reached the second target value, the step 1005 may roll the rollable display device 100 to make the unrolled status TP2 be transformed into the rolled status TP1.

In FIG. 14, in the method of this embodiment, the rolled status TP1 may be transformed into the unrolled status TP2 by the step 1002 to the step 1003. Furthermore, by the step 1005, the rollable display device 100 may be transformed from the unrolled status TP2 into the rolled status TP1.

Note that the above method is an example only, and the above method is not limited thereto. Other step may be performed before or after any above step or performed between above two steps. Note that the above method may be performed in different order. Note that, any above step may be changed (i.e., at least a portion of the above step may be deleted, optionally).

Figure 15:
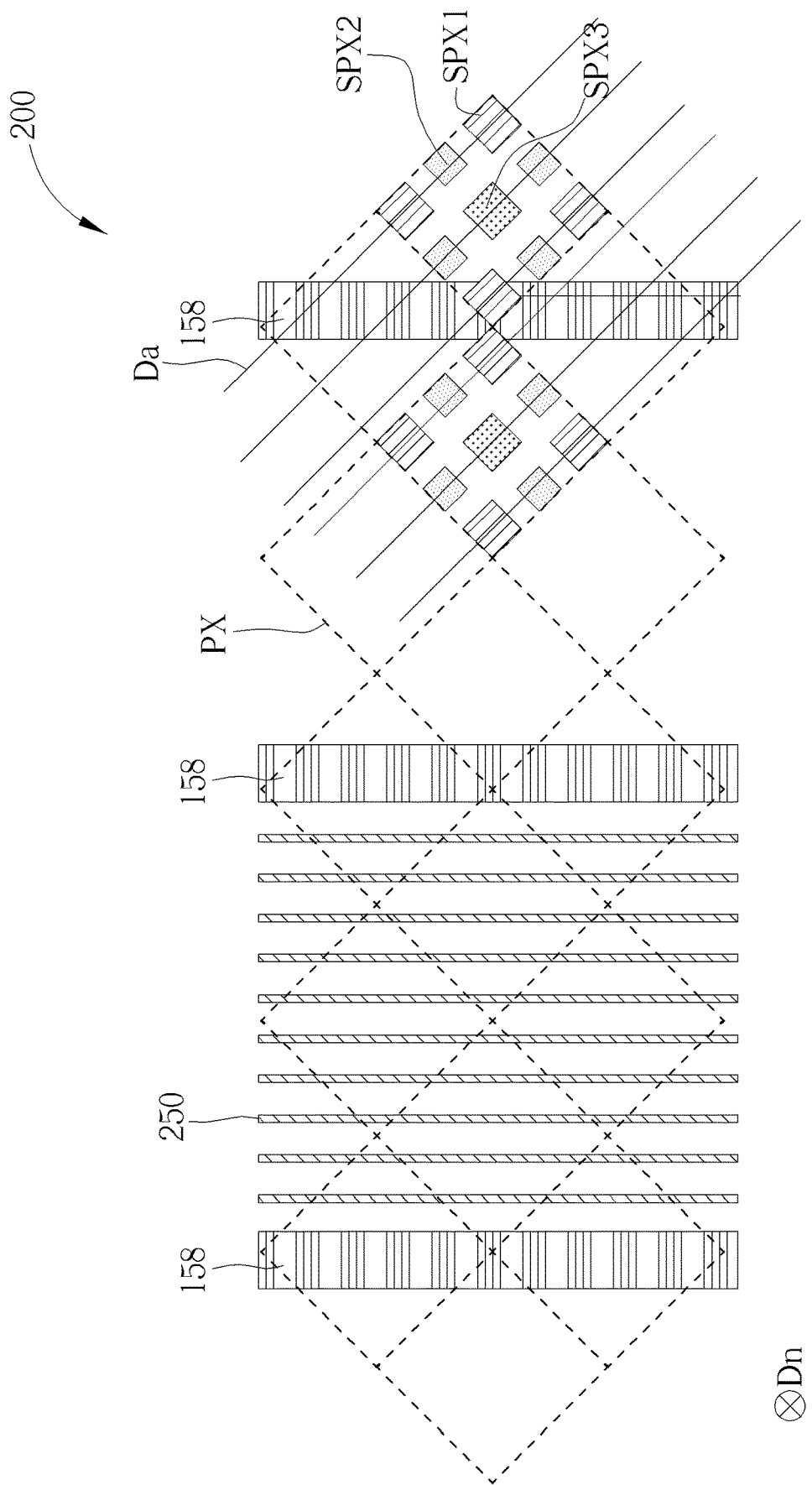
FIG. 15 is a schematic diagram showing a top view of controlling electrodes, a light emitting layer and data lines of an electronic device according to a second embodiment of the present disclosure.
Figure 16:
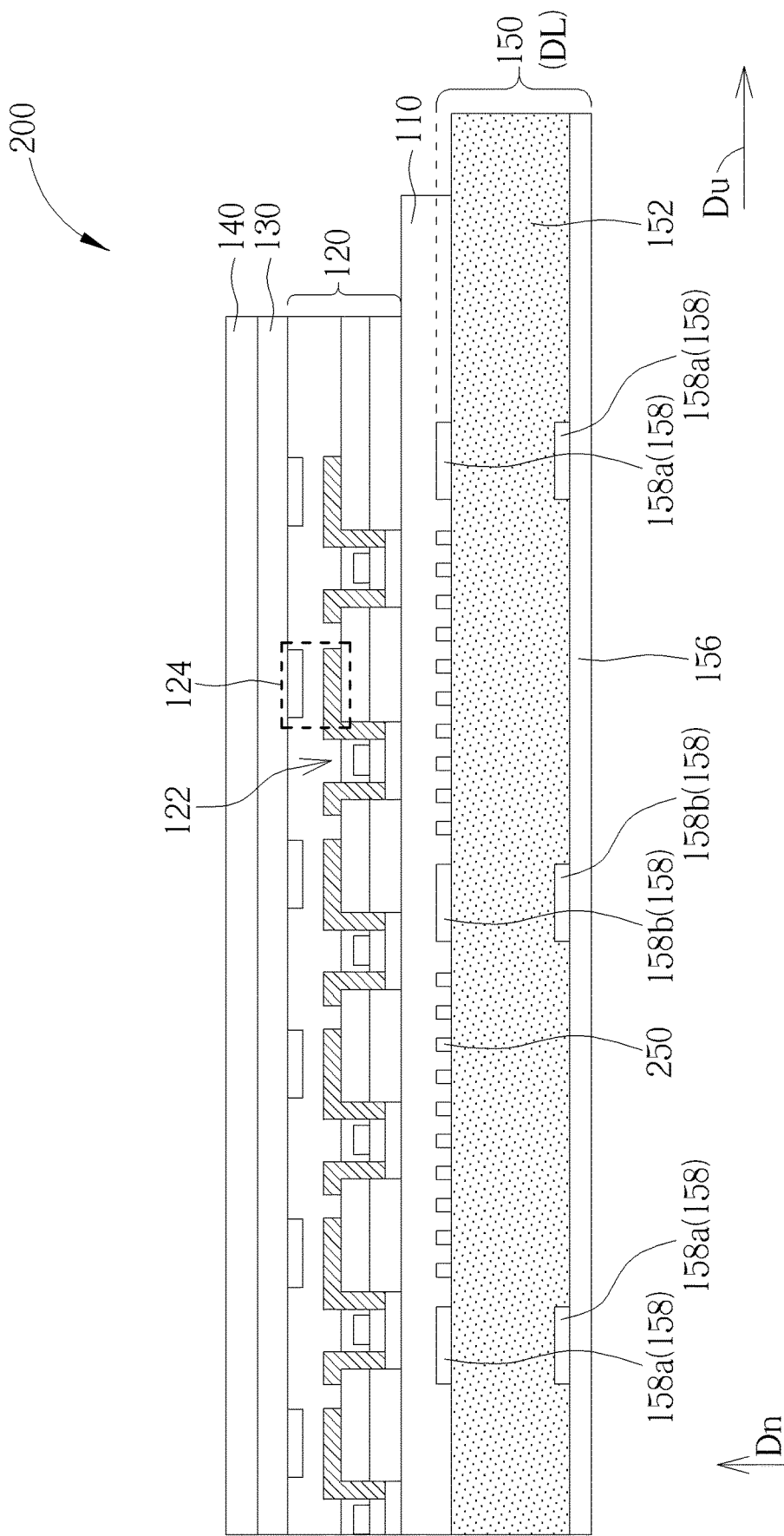
FIG. 16 is a schematic diagram showing a cross-sectional view of the electronic device according to the second embodiment of the present disclosure.

Referring to FIG. 15 and FIG. 16, FIG. 15 is a schematic diagram showing a top view of controlling electrodes, a light emitting layer and data lines of an electronic device according to a second embodiment of the present disclosure, and FIG. 16 is a schematic diagram showing a cross-sectional view of the electronic device according to the second embodiment of the present disclosure. In order to make the relation of the controlling electrodes 158, the light emitting layer (e.g., different sub-pixels) and the data lines (e.g., the disposed relation or the number relation) clear in FIG. 15, the left side of FIG. 15 only shows the controlling electrodes 158 and at least one conductive structure 250 and omits the sub-pixels, the data lines Da and other components, and the right side of FIG. 15 only shows the controlling electrodes 158, the sub-pixels SPX1, the sub-pixels SPX2, the sub-pixels SPX3 and the data lines Da and omits the conductive structure 250 and/or other components. As shown in FIG. 15 and FIG. 16, the electronic device 200 may optionally include at least one conductive structure 250. For example, the conductive structure 250 and one layer of the controlling electrodes 158 are formed of the same conductive layer, but not limited thereto. That is to say, the material of the conductive structure 250 is the same as the material of one layer of the controlling electrodes 158. In some embodiments, the conductive structure(s) 250 may be a wire-grid polarizer (WGP), touch electrodes, an antenna or other suitable component, but not limited thereto. In some embodiments, the number of the conductive structures 250 may be greater than the number of the controlling electrode(s) 158.

In some embodiments (as shown in the right side of FIG. 15), an extending direction of the data line Da may be the same as or different from an extending direction of the controlling electrode 158. In some embodiments (as shown in the right side of FIG. 15), an included angle is between the data line Da and the controlling electrode 158 (i.e., an included angle is between the extending direction of the data line Da and the extending direction of the controlling electrode 158), and the included angle may range from 20 degrees to 80 degrees (20 degrees≤included angle≤80 degrees) or from 40 degrees to 60 degree (40 degrees≤included angle≤60 degrees), but not limited thereto. In some embodiments (as shown in the right side of FIG. 15), a ratio of the number of the data lines Da to the number of the controlling electrodes 158 may be a positive integer (i.e., a ratio of the number of the data lines Da to the number of the controlling electrode 158 is n, and n is a positive integer), but not limited thereto. For example, in FIG. 15, the number of the data lines Da is six times the number of the controlling electrodes 158, but not limited thereto. The ratio may be adjusted based on requirement(s).

As shown in the right side of FIG. 15, in some embodiments (as shown in the right side of FIG. 15), the number of the data lines Da is greater than the number of the controlling electrodes 158. In some embodiments, the ratio of the number of the data lines Da to the number of the controlling electrodes 158 may not be a positive integer.

In some embodiments (as shown in FIG. 16), the deformable structure 150 may have two layers of the controlling electrodes 158, and these two layers of the controlling electrodes 158 are aligned (overlapped) with each other in the normal direction Dn of the substrate 110. For instance, the first controlling electrode 158a disposed on the upper side of the deformable unit 152 may be substantially aligned with the first controlling electrode 158a disposed on the lower side of the deformable unit 152 in the normal direction Dn of the substrate 110, and the second controlling electrode 158b disposed on the upper side of the deformable unit 152 may be substantially aligned with the second controlling electrode 158b disposed on the lower side of the deformable unit 152 in the normal direction Dn of the substrate 110, but not limited thereto. Moreover, in FIG. 16, the deformable layer DL may extend beyond the substrate 110 in the unrolled direction Du, but not limited thereto.

Figure 17:
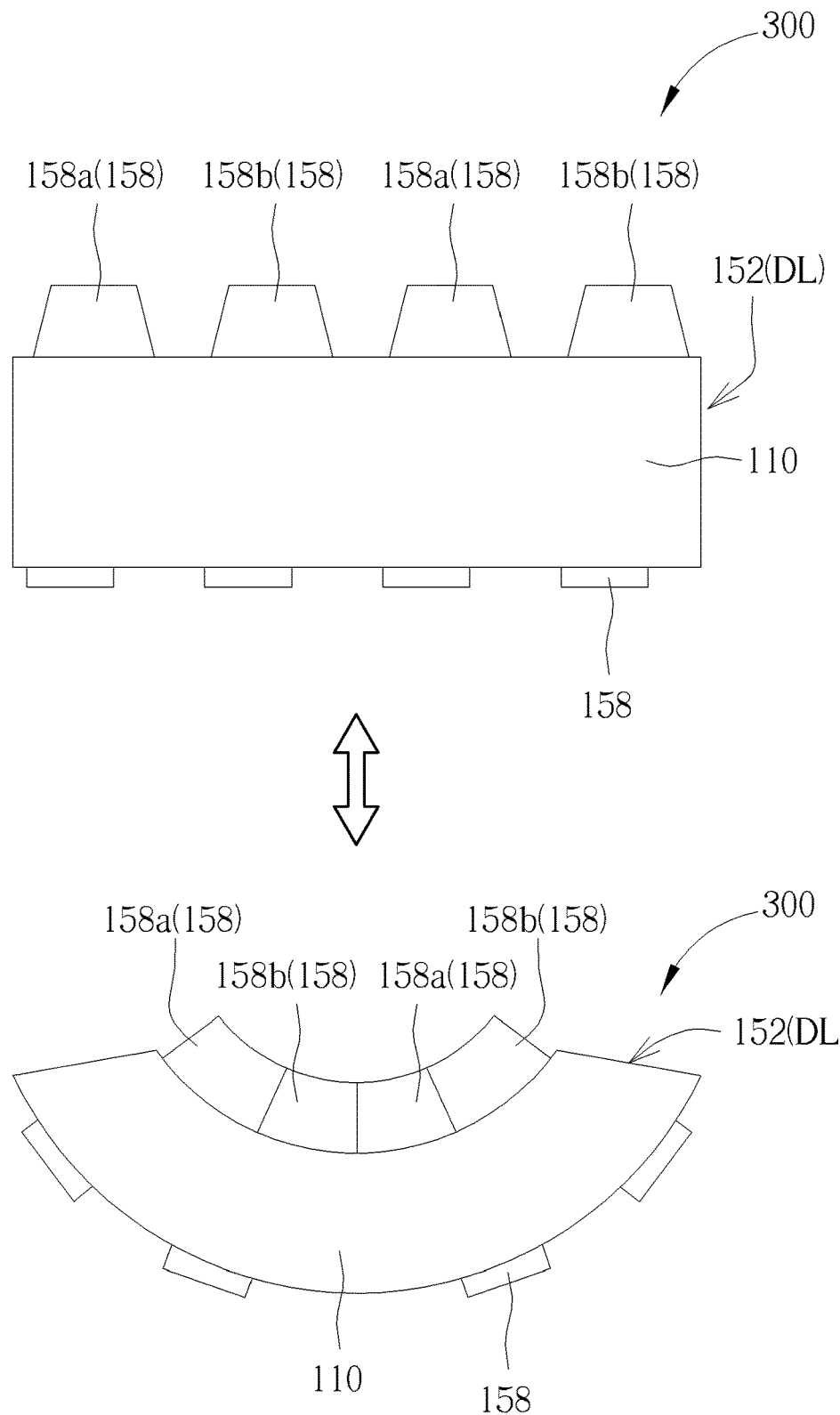
FIG. 17 is a schematic diagram showing a cross-sectional view of a deformable layer of an electronic device according to a third embodiment of the present disclosure.

Referring to FIG. 17, FIG. 17 is a schematic diagram showing a cross-sectional view of a deformable layer of an electronic device according to a third embodiment of the present disclosure. As shown in FIG. 17, the controlling electrodes 158 of the electronic device 300 of this embodiment may have a curvature detecting function. Based on the design of the controlling electrodes 158, the controlling electrodes 158 may detect whether the corresponding region of the electronic device 300 reaches the target curvature. For instance, in FIG. 17, the thickness of the controlling electrode 158 disposed on the upper side of the deformable layer DL may be greater than the thickness of the controlling electrode 158 disposed on lower side of the deformable layer DL. In addition, the cross-section pattern of the controlling electrode 158 disposed on the upper side of the deformable layer DL may be a trapezoid shape, but not limited thereto. If the electronic device 300 is rolled (as shown in the below plot of FIG. 17), the first controlling electrode 158a and the second controlling electrode 158b disposed on the upper side of the deformable layer DL may be in contact with each other, the first controlling electrode 158a and the second controlling electrode 158b may detect whether the current reaches the target curvature or not, but not limited thereto.

In some embodiments, the electronic device may optionally include a curvature detecting unit configured to detect the curvature of the corresponding region (e.g., the unrolled portion UP or the rolled portion RP) of the electronic device. In some embodiments, the first controlling electrode 158a and the second controlling electrode 158b shown in FIG. 17 may serve as the curvature detecting units. In some embodiments, according to the above, when the electronic device is stretched, the curvature detecting unit may detect the curvature of the corresponding region of the electronic device. When the curvature of the corresponding region reaches the target curvature (e.g., the curvature is less than or equal to the target curvature), it represents that the corresponding region has been unrolled, and the Young's modulus of the deformable layer DL in the corresponding region is increased for supporting the unrolled portion UP, but not limited thereto.

Figure 18:
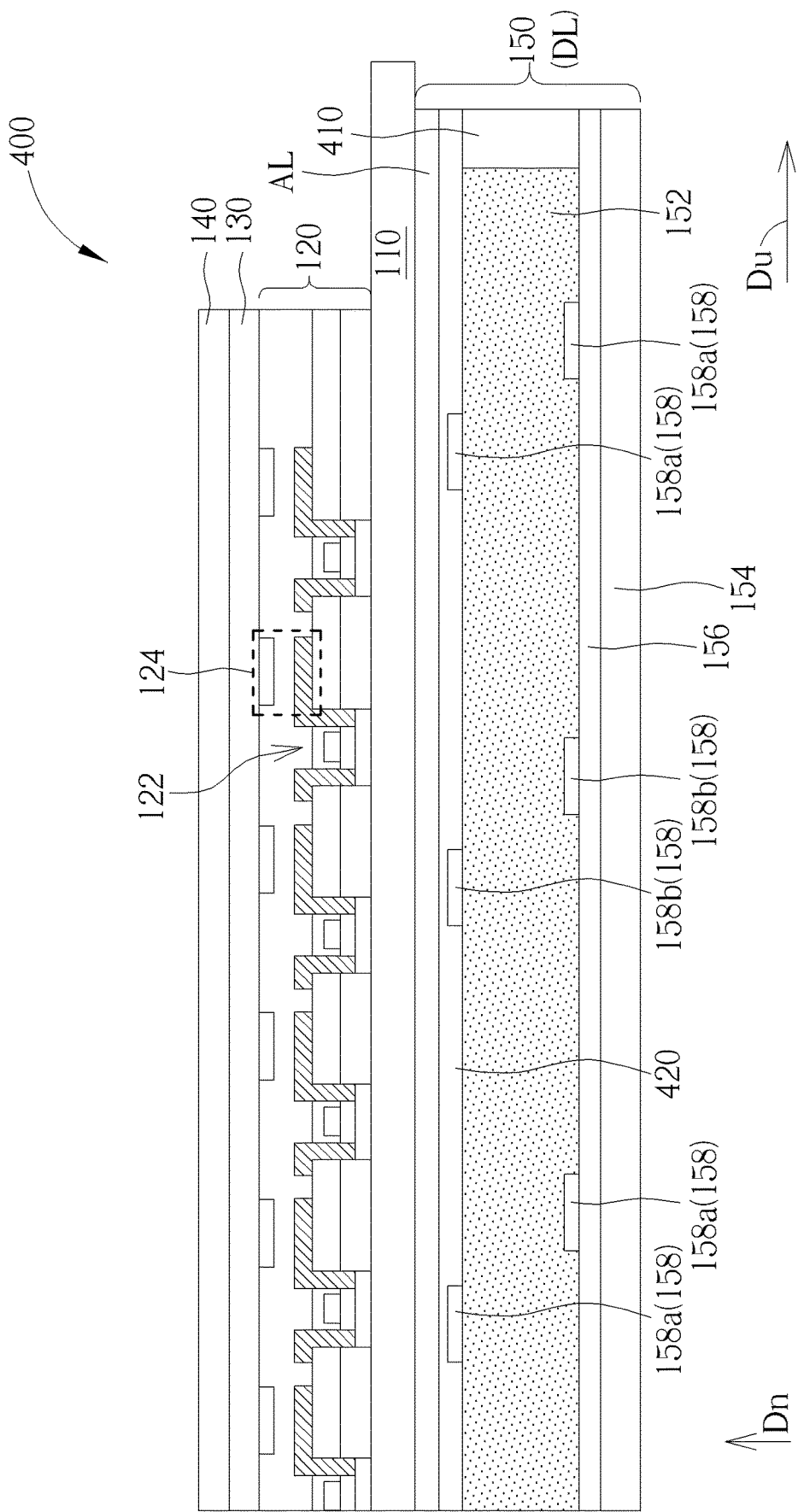
FIG. 18 is a schematic diagram showing a cross-sectional view of an electronic device according to a fourth embodiment of the present disclosure.

Referring to FIG. 18, FIG. 18 is a schematic diagram showing a cross-sectional view of an electronic device according to a fourth embodiment of the present disclosure. As shown in FIG. 18, the deformable layer DL of the electronic device 400 may include liquid deformable material, and the electronic device 400 may have a frame glue 410 configured to seal the deformable material. In addition, the deformable material of the deformable layer DL may be disposed between a bottom board 154 and a bottom board 420. In some embodiments, the hardness of the deformable layer DL or the viscosity of the deformable layer DL may be adjusted by electric signal to change the Young's modulus of the deformable layer DL.

In summary, in the electronic device of the present disclosure, the deformable layer may provide the unrolled portion with higher Young's modulus, so as to provide the sufficient supporting force for the unrolled portion. Moreover, the deformable layer may provide the rolled portion with the lower Young's modulus to make the electronic device be rolled easily, thereby increasing the use quality of the electronic device.

Although the embodiments and their advantages of the present disclosure have been described as above, it should be understood that any person having ordinary skill in the art can make changes, substitutions, and modifications without departing from the spirit and scope of the present disclosure. In addition, the protecting scope of the present disclosure is not limited to the processes, machines, manufactures, material compositions, devices, methods and steps in the specific embodiments described in the description. Any person having ordinary skill in the art can understand the current or future developed processes, machines, manufactures, material compositions, devices, methods and steps from the content of the present disclosure, and then, they can be used according to the present disclosure as long as the same functions can be implemented or the same results can be achieved in the embodiments described herein. Thus, the protecting scope of the present disclosure includes the above processes, machines, manufactures, material compositions, devices, methods and steps. Moreover, each claim constitutes an individual embodiment, and the protecting scope of the present disclosure also includes the combination of each claim and each embodiment. The protecting scope of the present disclosure shall be determined by the appended claims.

What is claimed is:

1. A rollable display device unrollable in a direction, comprising: a substrate; a plurality of light emitting units defining a light emitting layer on a surface of the substrate; and a plurality of deformable units defining a deformable layer on an opposite surface of the substrate, wherein an edge of an unrolled portion of the deformable layer extends beyond an edge of the light emitting layer in the direction in an unrolled status; wherein the direction is parallel to a longitudinal side of the rollable display device, the substrate extends beyond the light emitting layer, and the plurality of deformable units are aligned along the direction; wherein a Young's modulus of the deformable layer in the unrolled portion is greater than a Young's modulus of the deformable layer in a rolled portion; wherein in the unrolled portion, a thickness of the deformable units is continuously decreased with proximity of the rolled portion.

2. The rollable display device according to claim 1, wherein a distance between the edge of the unrolled portion of the deformable layer and the edge of the light emitting layer is greater than 1 mm.

3. The rollable display device according to claim 1, wherein a ratio of an area of the light emitting layer to an area of the deformable layer ranges from 0.7 to 1.4.

4. The rollable display device according to claim 1, wherein the deformable layer comprises a plurality of holes.

5. The rollable display device according to claim 4, wherein a density of the holes of the deformable layer in the unrolled portion is different from a density of the holes of the deformable layer in the rolled portion.

6. A rollable display device unrollable in a direction, comprising: a substrate; a plurality of light emitting units defining a light emitting layer on a surface of the substrate; and a plurality of deformable units defining a deformable layer on an opposite surface of the substrate, wherein an edge of an unrolled portion of the deformable layer is aligned with an edge of the light emitting layer in the direction in an unrolled status; wherein the direction is parallel to a longitudinal side of the rollable display device, the substrate extends beyond the light emitting layer, and the plurality of deformable units are aligned along the direction; wherein a Young's modulus of the deformable layer in the unrolled portion is greater than a Young's modulus of the deformable layer in a rolled portion; wherein in the unrolled portion, a thickness of the deformable units is continuously decreased with proximity of the rolled portion.

7. The rollable display device according to claim 6, wherein a ratio of an area of the light emitting layer to an area of the deformable layer ranges from 0.7 to 1.4.

8. The rollable display device according to claim 6, wherein the deformable layer comprises a plurality of holes.

* * * * *